(12) United States Patent
Ono et al.

(10) Patent No.: US 8,859,429 B2
(45) Date of Patent: Oct. 14, 2014

(54) POLISHING AGENT FOR COPPER POLISHING AND POLISHING METHOD USING SAME

(75) Inventors: Hiroshi Ono, Hitachi (JP); Takashi Shinoda, Hitachi (JP); Yuuhei Okada, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/412,893

(22) Filed: Mar. 6, 2012

(65) Prior Publication Data
US 2012/0160804 A1 Jun. 28, 2012

Related U.S. Application Data

(63) Continuation of application No. 13/201,529, filed as application No. PCT/JP2010/052069 on Feb. 12, 2010.

(30) Foreign Application Priority Data

Feb. 16, 2009 (JP) .................................. 2009-032635
May 19, 2009 (JP) .................................. 2009-121144
Dec. 22, 2009 (JP) .................................. 2009-290563
Jan. 22, 2010 (JP) ...................... PCT/JP2010/050806

(51) Int. Cl.
*H01L 21/302* (2006.01)
*C09G 1/02* (2006.01)
*C09K 13/06* (2006.01)
*B24B 37/04* (2012.01)
*C09K 3/14* (2006.01)
*H01L 21/321* (2006.01)
*H01L 21/768* (2006.01)

(52) U.S. Cl.
CPC .......... *H01L 21/3212* (2013.01); *B24B 37/044* (2013.01); *C09G 1/02* (2013.01); *C09K 3/1463* (2013.01); *H01L 21/76898* (2013.01); *H01L 21/7684* (2013.01)
USPC ............... 438/693; 216/88; 216/89; 216/105; 216/106; 252/79.1; 252/79.2; 252/79.4; 252/79.5

(58) Field of Classification Search
None
See application file for complete search history.

(56) References Cited

U.S. PATENT DOCUMENTS 6,428,721 B1 * 8/2002 Ina et al. ...................... 252/79.4
6,551,935 B1 * 4/2003 Sinha et al. ................... 438/693
(Continued)

FOREIGN PATENT DOCUMENTS

CN 1312843 A 9/2001
CN 1680511 A 10/2005
(Continued)

OTHER PUBLICATIONS

US Office Action dated Jul. 18, 2012, issued in corresponding U.S. Appl. No. 13/201,529.
(Continued)

*Primary Examiner* — Anita Alanko
(74) *Attorney, Agent, or Firm* — Westerman, Hattori, Daniels & Adrian, LLP

(57) ABSTRACT

A polishing agent for copper polishing, comprising (A) an inorganic acid with divalent or greater valence, (B) an amino acid, (C) a protective film-forming agent, (D) an abrasive, (E) an oxidizing agent and (F) water, wherein the content of the component (A) is at least 0.08 mol/kg, the content of the component (B) is at least 0.20 mol/kg, the content of the component (C) is at least 0.02 mol/kg, and either or both of the following conditions (i) and (ii) are satisfied.

(i): The proportion of the content of the component (A) with respect to the content of the component (C) is 2.00 or greater.

(ii): It further comprises (G) at least one kind selected from among organic acids and their acid anhydrides.

43 Claims, 3 Drawing Sheets

(56) References Cited

U.S. PATENT DOCUMENTS

| | | | |
|---|---|---|---|
| 6,803,353 B2* | 10/2004 | Martyak et al. | 510/175 |
| 7,128,825 B2* | 10/2006 | Liu et al. | 205/668 |
| 7,160,432 B2* | 1/2007 | Liu et al. | 205/647 |
| 7,186,653 B2* | 3/2007 | Jha et al. | 438/692 |
| 7,220,676 B2 | 5/2007 | Hagihara et al. | |
| 7,367,870 B2* | 5/2008 | Kurata et al. | 451/36 |
| 8,241,516 B2 | 8/2012 | Fujii et al. | |
| 8,491,807 B2* | 7/2013 | Uchida et al. | 216/88 |
| 2001/0039766 A1* | 11/2001 | Hattori et al. | 51/308 |
| 2002/0098701 A1* | 7/2002 | Hasegawa | 438/692 |
| 2004/0108302 A1 | 6/2004 | Liu et al. | |
| 2004/0159050 A1* | 8/2004 | Pasqualoni et al. | 51/307 |
| 2004/0175942 A1* | 9/2004 | Chang et al. | 438/689 |
| 2004/0229461 A1* | 11/2004 | Darsillo et al. | 438/689 |
| 2004/0248412 A1* | 12/2004 | Liu et al. | 438/689 |
| 2005/0090104 A1* | 4/2005 | Yang et al. | 438/689 |
| 2005/0199589 A1 | 9/2005 | Hirabayashi et al. | |
| 2007/0082456 A1* | 4/2007 | Uotani et al. | 438/427 |
| 2007/0128872 A1* | 6/2007 | Itoh et al. | 438/691 |
| 2008/0237535 A1* | 10/2008 | Maejima et al. | 252/79.1 |
| 2008/0311750 A1* | 12/2008 | Izumi et al. | 438/693 |
| 2009/0008600 A1* | 1/2009 | Jia et al. | 252/79.1 |
| 2009/0140199 A1* | 6/2009 | Kamiya et al. | 252/79.1 |
| 2009/0223136 A1* | 9/2009 | Nakajo et al. | 51/308 |
| 2010/0197201 A1 | 8/2010 | Nomura et al. | |
| 2010/0248480 A1 | 9/2010 | Darsillo et al. | |
| 2010/0301010 A1 | 12/2010 | Lin et al. | |
| 2011/0130000 A1 | 6/2011 | Park et al. | |
| 2012/0160804 A1 | 6/2012 | Ono et al. | |

FOREIGN PATENT DOCUMENTS

| | | |
|---|---|---|
| CN | 1842577 A | 10/2006 |
| JP | 02-278822 A | 11/1990 |
| JP | 2003-124160 A | 4/2003 |
| JP | 2006-302968 A | 11/2006 |
| JP | 2007-103485 A | 4/2007 |
| JP | 2007-150263 A | 6/2007 |
| JP | 2007-150264 A | 6/2007 |
| JP | 2008-186898 A | 8/2008 |
| JP | 4164941 B2 | 10/2008 |
| JP | 2008-270826 A | 11/2008 |
| KR | 10-2008-0069537 A | 7/2008 |
| TW | 200427827 A | 12/2004 |
| WO | 2004/063301 A1 | 7/2004 |

OTHER PUBLICATIONS

US Office Action Oct. 17, 2012, issued in corresponding U.S. Appl. No. 13/201,529.
International Search Report for PCT/JP2010/052069, mailing date of May 18, 2010.
Notification of Transmittal of Copies of Translation of the International Preliminary Report on Patentability ( Form PCT/IB/338) of International Application No. PCT/JP2010/050806 mailed Sep. 22, 2011 with Forms PCT/IB/373 and PCT/ISA/237.
Notification of Transmittal of Copies of Translation of the International Preliminary Report on Patentability (Form PCT/IB/338) of International Application No. PCT/JP2010/052069 mailed Sep. 22, 2011 with Forms PCT/IB/373 and PCT/ISA/237.
F. B. Kaufman et al. "Chemical-Mechanical Polishing for Fabricating Patterned W Metal Features as Chip Interconnects," Journal of Electrochemical Society, vol. 138, No. 11, 1991, pp. 3460-3464, Nov. 1991.
US Office Action dated Jan. 31, 2013, issued in corresponding U.S. Appl. No. 13/201,518.
Chinese Office Action dated Feb. 21, 2013, issued in corresponding Chinese Patent Application No. 201080007580.7 (7 pages).
US Office Action dated Aug. 14, 2013, issued in relate U.S. Appl. No. 13/201,529. (14 pages).
U.S. Office Action dated Jan. 24, 2013, issued in corresponding U.S. Appl. No. 13/201,529 (14 pages).
U.S. Office Action dated Jan. 24, 2014, issued in corresponding U.S. Appl. No. 13/201,529 (14 pages).
Japanese Notice of Allowance dated Jan. 7, 2014, issued in counterpart Japanese Patent Application No. 2011-257827.
Chinese Office Action dated Jan. 10, 2014, issued in counterpart Chinese Patent Application No. 201210135608.6.

* cited by examiner (a)

(b)

(c)

(a)

(b)

(c)

(a)

(b)

(c)

POLISHING AGENT FOR COPPER POLISHING AND POLISHING METHOD USING SAME

CROSS-REFERENCE TO RELATED APPLICATIONS

This application is a continuation of application Ser. No. 13/201,529 filed Aug. 15, 2011, which is a 371 of PCT/JP2010/052069 filed Feb. 12, 2010.

TECHNICAL FIELD

The present invention relates to a polishing agent for copper polishing and to a polishing method using the same. The present invention further relates to a polishing agent for copper polishing that is particularly suitable for use in chemical mechanical polishing (CMP) steps and gives high polishing speed and high smoothness after polishing, and to a polishing method using it.

BACKGROUND ART

The use of copper alloys as wiring material substitutes for conventional aluminum alloys is advancing, with the aim of increasing the performance of LSI. Copper alloys are poorly suitable for micromachining by dry etching which is often used for forming conventional aluminum alloy wiring. The "damascene method" has therefore been largely employed for micromachining of copper alloys, in which method a copper alloy thin-film is accumulated on an insulating film having pre-formed furrows (concave portions) and elevated sections (convex portions) to embed the copper alloy in the furrows, and then the copper alloy thin-film accumulated on the elevated sections (the copper alloy thin-film on sections other than the furrows) is removed by CMP to form embedded wiring (see Patent document 1, for example).

The common method of CMP for metals such as copper alloys involves attaching a polishing cloth (polishing pad) onto a circular platen, wetting the polishing cloth surface with a polishing agent for metals, pressing the metal film-formed surface of a base substrate against the polishing cloth surface, rotating the platen with a prescribed pressure (hereunder referred to as "polishing pressure") being applied to the metal film from the back side of the base substrate, and removing the metal film on the elevated sections by mechanical friction between the polishing agent and the metal film on the elevated sections.

A polishing agent for metals used for CMP usually comprises an oxidizing agent and a solid abrasive (hereunder referred to simply as "abrasive"), with a metal oxide solubilizer, protective film-forming agent and the like if necessary. The basic mechanism of CMP employing a polishing agent comprising an oxidizing agent is considered to be that the metal film is polished by, first, oxidizing the metal film surface with the oxidizing agent to form an oxidation layer, and shaving of the oxidation layer with the abrasive.

In this polishing method, since the oxidation layer on the metal film surface of the furrows of the insulating film is not significantly contacted by the polishing cloth and is not reached by the shaving effect of the abrasive, the metal film on the elevated sections is removed as CMP proceeds, thus smoothing the base surface (see Non-patent document 1, for example).

In ordinary manufacturing of an LSI, the film thickness of the copper alloy film to be polished is about 1 μm, and a polishing agent which allows a polishing speed of about 5000 Å/min is used (see Patent document 2, for example).

In recent years, CMP treatment of copper alloys is being applied for manufacture of high performance microcircuit boards such as package boards, and for the formation of Through Silicon Vias (TSV) that have become an object of interest in new mounting methods.

However, the metal film thicknesses are larger for such purposes compared to LSIs, and therefore problems of low polishing speed and reduced productivity occur with conventional LSI polishing agents. TSVs, in particular, commonly require polishing of copper alloy films with film thicknesses of 5 μm or greater and sometimes 10 μm or greater, and therefore polishing agents that allow higher polishing speeds are desired.

Patent document 3 thus discloses a polishing agent which allows polishing of copper alloy films at polishing speeds that are higher than the prior art (about 22000-29000 Å/min).

CITATION LIST

Patent Literature

[Patent document 1] Japanese Unexamined Patent Application Publication HEI No. 2-278822
[Patent document 2] Japanese Unexamined Patent Application Publication No. 2003-124160
[Patent document 3] Japanese Unexamined Patent Application Publication No. 2007-150263

Non-Patent Literature

[Non-patent document 1] Journal of Electrochemical Society, Vol. 138, No. 11 (1991), p. 3460-3464

SUMMARY OF INVENTION

Technical Problem

The polishing agent described in Patent document 3 can be applied as a polishing agent for TSVs, but with desire for improved productivity, there exists a demand for a polishing agent that allows smooth polishing of copper alloy films at higher polishing speed.

In light of these circumstances, it is an object of the present invention to provide a polishing agent for copper polishing that allows smooth polishing of copper films at high polishing speed, and that allows rapid polishing treatment and can ensure sufficient productivity even for purposes that require polishing of thick metal films, such as high performance circuit boards, TSVs and the like, as well as a polishing method using the same.

Solution to Problem

The present inventors have found that a polishing agent that allows smooth polishing of copper film at high polishing speed can be obtained by controlling the contents of inorganic acid with divalent or greater valence (hereunder referred to simply as "inorganic acid"), amino acid and protective film-forming agent to at least prescribed minimum amounts. The present inventors have further found that if at least one of the following conditions (i) and (ii) are satisfied, in addition to controlling the contents of inorganic acid, amino acid and protective film-forming agent to at least prescribed minimum amounts, it is possible to obtain a polishing agent with high polishing speed for copper (a polishing speed exceeding 30000 Å/min, for example), which is useful for high performance circuit board and TSV purposes.

Condition (i): The proportion of the inorganic acid content (mol/kg) with respect to the protective film-forming agent content (mol/kg) (inorganic acid content/protective film-forming agent content) is 2.00 or greater.

Condition (ii): The polishing agent contains at least one kind selected from among organic acids and their acid anhydrides.

Specifically, the present invention provides, as a first embodiment, a polishing agent for copper polishing comprising (A) an inorganic acid, (B) an amino acid, (C) a protective film-forming agent, (D) an abrasive, (E) an oxidizing agent and (F) water, wherein the content of the component (A) is at least 0.08 mol/kg, the content of the component (B) is at least 0.20 mol/kg, the content of the component (C) is at least 0.02 mol/kg, and the proportion of the content of the component (A) with respect to the content of the component (C) is 2.00 or greater.

The invention also provides, as a second embodiment, a polishing agent for copper polishing comprising (A) an inorganic acid, (B) an amino acid, (C) a protective film-forming agent, (D) an abrasive, (E) an oxidizing agent, (F) water and (G) at least one kind selected from among organic acids and their acid anhydrides, wherein the content of the component (A) is at least 0.08 mol/kg, the content of the component (B) is at least 0.20 mol/kg, and the content of the component (C) is at least 0.02 mol/kg.

In the invention, unless otherwise specified, "copper" includes pure copper as well as copper-containing metals (such as copper alloys, copper oxides and copper alloy oxides). Also in the invention, unless otherwise specified, the term "polishing agent for copper polishing" means a polishing agent for polishing of a metal film composed of pure copper, a metal film comprising copper (for example, a copper alloy film), or a laminated film comprising such a metal film and another metal.

The polishing agent for copper polishing allows smooth polishing of copper films at high polishing speed, allows rapid polishing treatment and can ensure sufficient productivity even for purposes that require polishing of thick metal films, such as high performance circuit boards, TSVs and the like. In addition, since the polishing agent for copper polishing is a pH buffer solution comprising (A) an inorganic acid and (B) an amino acid with powerful dissolving action, it is resistant to variations in pH even when the copper as the target to be polished dissolves in the polishing agent. Consequently, high polishing speed can be stably maintained without dependence on the extent to which the polishing progresses.

The amount of potassium hydroxide required to increase the pH of the polishing agent for copper polishing of the first embodiment (excluding pH regulators when the polishing agent for copper polishing contains acidic components such as aqueous hydrochloric acid or alkaline components such as ammonia water, as pH regulators) to 4 is preferably at least 0.10 mol per 1 kg of polishing agent for copper polishing. Such a polishing agent allows even smoother polishing of copper films at even higher polishing speed, and allows more rapid polishing treatment to ensure sufficient productivity even for purposes that require polishing of thick metal films, such as high performance circuit boards, TSVs and the like.

Furthermore, by satisfying both of conditions (i) and (ii) according to the invention, it is possible to accomplish even smoother polishing of copper films at even higher polishing speed, and to accomplish even more rapid polishing treatment to ensure sufficient productivity even for purposes that require polishing of thick metal films, such as high performance circuit boards, TSV and the like. Specifically, the invention provides, as a third embodiment, a polishing agent for copper polishing comprising (A) an inorganic acid, (B) an amino acid, (C) a protective film-forming agent, (D) an abrasive, (E) an oxidizing agent, (F) water and (G) at least one kind selected from among organic acids and their acid anhydrides, wherein the content of the component (A) is at least 0.08 mol/kg, the content of the component (B) is at least 0.20 mol/kg, the content of the component (C) is at least 0.02 mol/kg, and the proportion of the content of the component (A) with respect to the content of the component (C) is 2.00 or greater.

In the polishing agent for copper polishing according to the second and third embodiments, the amount of potassium hydroxide required to increase the pH of the composition obtained by removing component (G) from the polishing agent for copper polishing (also excluding pH regulators when the polishing agent for copper polishing contains acidic components such as aqueous hydrochloric acid or alkaline components such as ammonia water, as pH regulators) to 4 is preferably at least 0.10 mol per 1 kg of the composition. Such a polishing agent allows even smoother polishing of copper films at even higher polishing speed, and allows even more rapid polishing treatment to ensure sufficient productivity even for purposes that require polishing of thick metal films, such as high performance circuit boards, TSVs and the like.

The content of the component (G) in the polishing agent for copper polishing according to the second and third embodiments is preferably at least 0.02 mol/kg.

In the polishing agent for copper polishing according to the second and third embodiments, the component (G) is preferably at least one kind selected from among organic acids with two carboxyl groups and pKa values of not greater than 2.7, their acid anhydrides, and organic acids with 3 or more carboxyl groups.

Organic acids with 2 carboxyl groups and pKa values of not greater than 2.7 have stronger interaction with copper surfaces than organic acids with pKa values exceeding 2.7, and such organic acids and their acid anhydrides are considered to have high improving effects on polishing speed. Also, organic acids with 3 or more carboxyl groups, whether with pKa values of 2.7 or lower or pKa values exceeding 2.7, exhibit strong interaction with copper due to the presence of their 3 or more carboxyl groups, and are considered to have high improving effects on polishing speed.

Here, "pKa" is the acid dissociation constant for the first dissociable acidic group, and it is the negative common logarithm of the equilibrium constant Ka of the group.

In the polishing agent for copper polishing according to the second and third embodiments, the component (G) is preferably at least one kind selected from among oxalic acid, maleic acid, maleic anhydride, malonic acid and citric acid. These compounds for component (G) notably improve polishing speed compared to other organic acids and their acid anhydrides added in the same amounts.

The pH of the polishing agent for copper polishing of the invention is preferably 1.5-4.0. This will aid in the function as a pH buffer solution, and will facilitate stable maintenance of a high polishing speed.

In the polishing agent for copper polishing of the invention, the component (A) is preferably at least one kind selected from among sulfuric acid and phosphoric acid. This will allow even higher levels of both polishing speed and smoothness to be achieved.

The polishing agent for copper polishing of the invention preferably comprises an amino acid with a pKa of 2-3 as component (B). This will allow the desired value for the pH of the polishing agent for copper polishing to be easily obtained.

In the polishing agent for copper polishing of the invention, component (C) is preferably a triazole compound, and the triazole compound is more preferably at least one kind selected from among benzotriazole and its derivatives. Such compounds can further improve polishing speed, while also allowing the obtained polishing agent to exhibit excellent balance between polishing speed and corrosion resistance.

In the polishing agent for copper polishing of the invention, preferably, component (D) is at least one kind selected from among colloidal silica and colloidal alumina, and the mean particle size of component (D) preferably is not greater than 100 nm.

In the polishing agent for copper polishing of the invention, component (E) is preferably at least one kind selected from among hydrogen peroxide, persulfuric acid and persulfuric acid salts. Such compounds for component (E) are preferred as oxidizing agents because of their especially high polishing-promoting effects.

The invention further provides a polishing method wherein the polishing agent for copper polishing described above is used for polishing of a copper-containing metal film, to remove at least a portion of the metal film.

According to this polishing method, it is possible to achieve both high polishing speed and an effect of inhibiting roughening of the surface state of metal films after completion of polishing, and to achieve both increased productivity and increased product yield even for purposes that require polishing of thick metal films, such as high performance circuit boards, TSVs and the like.

Since high polishing speed and smooth polishing are both accomplished by this polishing method, it can be suitably applied for metal films wherein the maximum thickness of the metal film is 5 μm or greater, and especially 10 μm or greater. The "maximum thickness of the metal film" is the maximum thickness of the metal film at the section to be polished, and it does not include the thickness of the metal film in the concave portions when the metal film is formed on concave portions of the substrate.

Moreover, since both high polishing speed and smooth polishing can be achieved by the polishing method, it is possible to obtain a polishing speed of 30000 Å/min or greater for metal films.

Advantageous Effects of Invention

The polishing agent for copper polishing of the invention exhibits an exceptionally higher polishing speed for copper than ordinary polishing agents. In particular, according to the invention it is possible to obtain a polishing agent having a polishing speed of greater than 30000 Å/min for copper, and it is therefore possible to provide a polishing agent for copper polishing that is optimal for rapid polishing of large amounts of copper, such as on high performance circuit boards, TSVs and the like, as well as a polishing method using the same. Moreover, the polishing agent for copper polishing of the invention allows polishing of copper films at a high polishing speed, as well as smooth polishing of copper films.

DESCRIPTION OF EMBODIMENTS

First Embodiment

Figure 1:
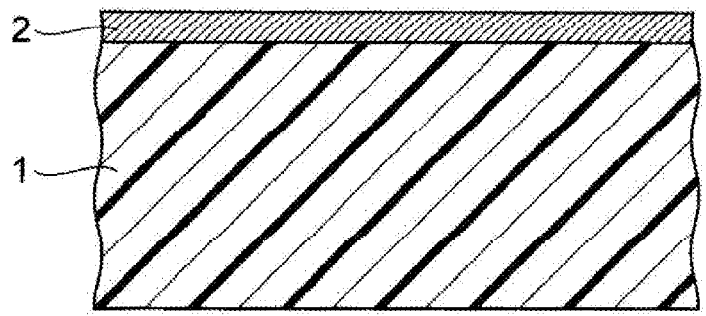
FIGS. 1(a)-(c) are first process drawings that illustrate a method of using a polishing agent according to an embodiment of the invention for VIA-LAST.
Figure 1:
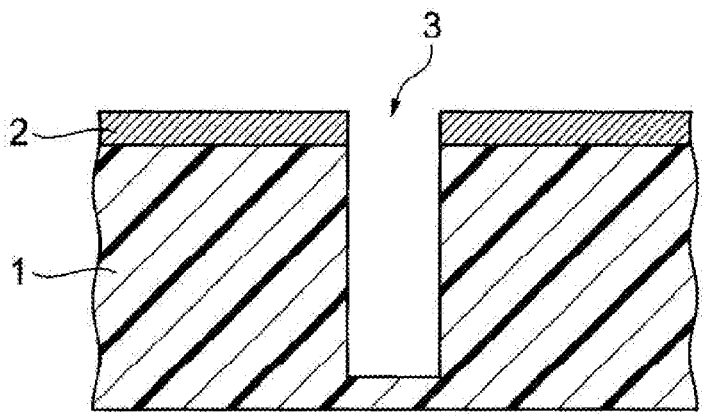
Figure 1:
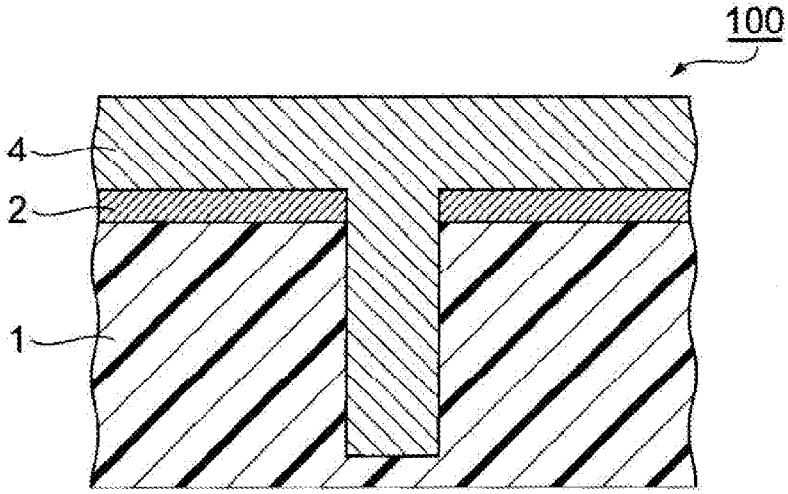

The polishing agent for copper polishing according to the first embodiment of the invention (hereunder referred to simply as "polishing agent") satisfies condition (i) above. That is, the polishing agent according to the first embodiment comprises (A) an inorganic acid, (B) an amino acid, (C) a protective film-forming agent, (D) an abrasive, (E) an oxidizing agent and (F) water, wherein the content of the component (A) is at least 0.08 mol/kg, the content of the component (B) is at least 0.20 mol/kg, the content of the component (C) is at least 0.02 mol/kg, and the proportion of the content of the component (A) (mol/kg) with respect to the content of the component (C) (mol/kg) is 2.00 or greater.

Although some improvement in polishing speed can be achieved by using either component (A) or component (B) alone, this does not provide an improving effect on polishing speed that is commensurate with the content. On the other hand, according to the polishing agent of the first embodiment, drastic improvement in the polishing speed of the polishing agent can be achieved by using component (A) and component (B) together while adjusting their contents to the specific contents mentioned above. From another standpoint, the polishing agent of the first embodiment exhibits an effect which allows reduction in the component (A) and component (B) contents necessary to obtain a given improving effect on polishing speed, compared to using either component (A) or component (B) alone.

In conventional polishing agents, the use of component (C) has provided an effect of inhibiting etching of copper, by formation of a protective film on the copper surface, but in most cases this has interfered with the polishing speed. In contrast, the polishing agent of the first embodiment, which employs a combination of prescribed amounts of component (A) and component (B) with the use of a specific amount of component (C), can exhibit an effect of maintaining a high level of polishing speed while minimizing the etching rate.

While the reason for the effect of improved polishing speed by the polishing agent of the first embodiment is not completely understood, the present inventors conjecture as follows. That is, the effect of component (C) and component (A) results in formation of a "reaction layer" comprising component (C) and copper ion on the copper surface. Also, chelation of component (B) to the copper ion presumably renders the reaction layer more removable, so that polishing is promoted.

It is believed that such multiple polishing processes do not proceed simultaneously and independently in parallel, but rather each individual polishing process proceeds in linkage with another polishing process. Thus, if one of component (A), component (B) and component (C) is increased, the polishing process depending on the other components is the bottleneck (rate-determining step), and the overall polishing speed is not effectively increased. On the other hand, the polishing agent of the first embodiment employs specific amounts of each component, so that each polishing process can be promoted and the polishing speed can be effectively increased.

Each of the constituent components of the polishing agent of the first embodiment will now be explained in greater detail.

(pH)

The pH of the polishing agent of the first embodiment is preferably in the range of 1.5-4.0 from the viewpoint of obtaining high polishing speed for copper by CMP, and avoiding corrosion of the copper film. If the pH is at least 1.5, it will tend to be easier to reduce the surface roughness of the copper film, and from the same viewpoint the pH is preferably at least 2.0. If the pH is not higher than 4.0, the polishing speed by CMP will tend to increase and the polishing agent will thus be more practical, while from the same viewpoint the pH is more preferably not higher than 3.5 and even more preferably not higher than 3.0.

The polishing agent of the first embodiment is a pH buffer solution comprising an inorganic acid as component (A). Inorganic acids are generally strong acids, and including a large amount of inorganic acid will lower the pH, making it difficult to adjust the pH to within the prescribed range (for example, the range of 1.5-4.0). In the polishing agent of the first embodiment, however, an amino acid is also added as component (B) in addition to the inorganic acid, and adjusting the component (A) and component (B) contents allows the polishing agent to be easily prepared as a pH buffer solution having a pH in a prescribed range (for example, the range of 1.5-4.0).

The pH of the polishing agent of the first embodiment may be adjusted by the additive amount of the constituent components of the polishing agent (for example, the inorganic acid or amino acid) for adjustment to the desired pH, and an acidic component or alkaline component may also be added as a pH regulator. Examples of such pH regulators include monovalent inorganic acids such as hydrochloric acid and nitric acid, and bases such as ammonia, sodium hydroxide and tetramethylammonium hydroxide. These may be used alone or in combinations of two or more. Naturally, addition of a pH regulator is unnecessary if the pH is already within the desired range without a pH regulator. The monovalent inorganic acid used as a pH regulator is not included in component (A).

The pH of the polishing agent of the first embodiment can be measured with a pH meter (for example, a Model PH81 by Yokogawa Electric Corp.). The pH is the value that is obtained by using standard buffer (phthalate pH buffer: pH 4.01 (25° C.), neutral phosphate pH buffer: pH 6.86 (25° C.)), placing an electrode in the polishing agent after 2-point calibration and measuring the value upon stabilization after an elapse of 2 minutes or more.

(Component (A): Inorganic Acid)

Component (A) is an inorganic acid with divalent or greater valence (a non-monovalent inorganic acid), and known ones may be used without any particular restrictions, including for example, divalent acids such as sulfuric acid, chromic acid, carbonic acid, molybdic acid, hydrogen sulfide, sulfurous acid, thiosulfuric acid, selenic acid, telluric acid, tellurous acid, tungstic acid and phosphoric acid, trivalent acids such as phosphoric acid, phosphomolybdic acid, phosphotungstic acid and vanadic acid, and acids with tetravalent or greater valence such as silicomolybdic acid, silicotungstic acid, pyrophosphoric acid and tripolyphosphoric acid. These may be used alone or in combinations of two or more.

Strong acids (defined as acids with pKa values of not greater than 0, same hereunder) are preferred among these acids for component (A) for even higher polishing speed by CMP. Specific strong acids include sulfuric acid, chromic acid, phosphomolybdic acid, silicomolybdic acid, phosphotungstic acid and silicotungstic acid, with sulfuric acid being more preferred form the viewpoint of even higher polishing speed by CMP and ready availability.

Weak acids (defined as acids with pKa values of greater than 0, same hereunder) are preferred from the viewpoint of further reducing surface roughness of the copper film. Specific weak acids include carbonic acid, molybdic acid, hydrogen sulfide, sulfurous acid, thiosulfuric acid, selenic acid, telluric acid, tellurous acid, tungstic acid, phosphoric acid, phosphoric acid, pyrophosphoric acid, tripolyphosphoric acid and vanadic acid, with phosphoric acid being preferred.

From the viewpoint of achieving even higher levels of both polishing speed and surface roughness, it is preferred to use a combination of a strong acid and a weak acid, with a mixture of sulfuric acid and phosphoric acid being especially preferred from this standpoint.

The content of the component (A) is at least 0.08 mol/kg, preferably at least 0.09 mol/kg and more preferably at least 0.1 mol/kg with respect to the total amount of the polishing agent, from the viewpoint of more excellent polishing speed. The content of the component (A) is preferably not greater than 1.0 mol/kg and more preferably not greater than 0.8 mol/kg from the viewpoint of inhibiting increase in the content of the component (A), since a polishing speed tends not to increase even if component (A) is added in greater than a certain amount.

(Component (B): Amino Acid)

Component (B) is an amino acid used for the purpose of adjusting the pH and dissolving the copper. There are no particular restrictions on component (B) so long as it is an amino acid that dissolves even slightly in water, and examples include at least one kind selected from among glycine, alanine, valine, leucine, isoleucine, serine, threonine, cysteine, cystine, methionine, aspartic acid, glutamic acid, lysine, arginine, phenylalanine, tyrosine, histidine, tryptophan, proline and oxyproline. These may be used alone or in combinations of two or more.

Preferred for use as component (B) are amino acids with pKa values of 2-3, from the viewpoint of easier adjustment of the pH of the polishing agent (for example, to a range of 1.5-4.0). More specifically, among the compounds mentioned above, such amino acids are preferably glycine, alanine, valine, leucine, isoleucine, serine, threonine, methionine, aspartic acid, glutamic acid, lysine, arginine, tryptophan and the like. Glycine is more preferred as component (B) from the viewpoint of a higher improving effect on polishing speed, and low cost. For the "pKa" value, reference may be made to Kagaku Binran, Kisohen II (5th Revision, Maruzen).

The content of the component (B) is at least 0.20 mol/kg and preferably at least 0.25 mol/kg with respect to the total amount of the polishing agent, from the viewpoint of more excellent polishing speed. The content of the component (B) is preferably not greater than 2.0 mol/kg and more preferably not greater than 1.8 mol/kg from the viewpoint of inhibiting increase in the content of the component (B), since a polishing speed tends not to increase even if component (B) is added in greater than a certain amount.

(Component (C): Protective Film-Forming Agent)

The protective film-forming agent as component (C) is a substance with an effect of forming a protective film on the copper surface, and it is referred to as an "anticorrosive" or "inhibitor". However, the protective film-forming agent is believed to form a "reaction layer" that is removed as polishing progresses as described above, and it is not necessarily limited to the agent forming a "protective film" to prevent polishing of copper.

Substances known in the prior art may be used as component (C) without any particular restrictions so long as they have water-solubility sufficient to effectively exhibit the effect of addition of the protective film-forming agent. Examples for component (C) include nitrogen-containing compounds such as quinaldinic acid, anthranilic acid, salicylaldoxime, triazole compounds, imidazole compounds, pyrazole compounds and tetrazole compounds. Nitrogen-containing heterocyclic compounds are preferred among these compounds for component (C), with triazole compounds being particularly preferred. These may be used alone or in combinations of two or more.

Examples of triazole compounds include 1,2,3-triazole, 1,2,4-triazole, triazole derivatives such as 3-amino-1H-1,2,4-triazole; benzotriazole; and benzotriazole derivatives such as 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-)benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl]phosphonic acid and 3-aminotriazole; among which there are preferably used at least one kind selected from among benzotriazole and benzotriazole derivatives, from the viewpoint of excellent balance between polishing speed and corrosion resistance.

Examples of imidazole compounds include 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole and 2-aminoimidazole.

Examples of pyrazole compounds include 3,5-dimethylpyrazole, 3-amino-5-methylpyrazole, 4-methylpyrazole and 3-amino-5-hydroxypyrazole.

Examples of tetrazole compounds include 1H-tetrazole, 5-amino-1H-tetrazole, 5-methyl-1H-tetrazole, 5-phenyl-1H-tetrazole and 1-(2-diaminoethyl)-5-mercaptotetrazole.

The content of the component (C) is at least 0.02 mol/kg, preferably at least 0.025 mol/kg and more preferably at least 0.03 mol/kg with respect to the total amount of the polishing agent, from the viewpoint of allowing the metal surface roughness to be even further reduced. The content of the component (C) is preferably not greater than 0.3 mol/kg and more preferably not greater than 0.25 mol/kg from the viewpoint of inhibiting increase in the content of the component (C), since a polishing speed tends not to increase even if component (C) is added in greater than a certain amount.

The proportion of the content of the component (A) (mol/kg) with respect to the content of the component (C) (mol/kg) ((component (A) content/component (C) content) is 2.00 or greater from the viewpoint of superior polishing speed. From the viewpoint of allowing a polishing agent with even more excellent polishing speed to be obtained, the proportion is preferably 2.30 or greater, more preferably 2.50 or greater and even more preferably 2.80 or greater. The proportion is preferably not greater than 12 and more preferably not greater than 10, from the viewpoint of further inhibiting increase in surface roughness.

(Component (D): Abrasive)

Component (D) is not particularly restricted, and examples thereof include inorganic material abrasives such as silica, alumina, zirconia, ceria, titania and silicon carbide, and organic material abrasives such as polystyrene, polyacryl and polyvinyl chloride. Among these compounds for component (D), silica and alumina are preferred from the viewpoint of their satisfactory dispersion stability in polishing agents and their low frequency of polishing damage (scratches) generated by CMP, while colloidal silica and colloidal alumina are more preferred from the viewpoint of easy particle size control and excellence in terms of polishing properties. Hydrolysis of silicon alkoxides or ion-exchange of sodium silicate are known methods for production of colloidal silica. Hydrolysis of aluminum nitrate is a known method for production of colloidal alumina. Component (D) may be used alone or in combinations of two or more.

Also, from the viewpoint of more excellent polishing speed and low surface roughness after polishing, component (D) is preferably an abrasive with a mean particle size of not greater than 100 nm, and it is more preferably at least one kind of abrasive selected from among colloidal silica and colloidal alumina with a mean particle size of not greater than 100 nm. The "mean particle size" of the particles is the D50 value (the median diameter of the volume distribution, or the cumulative median), obtained by measuring the polishing agent for copper polishing with a laser diffraction-type particle size distribution meter.

The content of the component (D) is preferably at least 0.1 mass % and more preferably at least 0.2 mass % with respect to the total amount of the polishing agent, from the viewpoint of obtaining a sufficient physical grinding effect and further increasing the polishing speed. From the viewpoint of avoiding saturation of the polishing speed, whereby no further increase in polishing speed is observed even with addition of component (D) above a certain level, and minimizing abrasive aggregation and increased polishing damage, the content of the component (D) is preferably not greater than 10 mass % and more preferably not greater than 5 mass %.

(Component (E): Oxidizing Agent)

Component (E) may be used without any particular restrictions so long as it is an oxidizing agent having an oxidizing effect on copper. Examples for component (E) include hydrogen peroxide ($H_2O_2$), persulfuric acid, persulfuric acid salts such as ammonium persulfate and potassium persulfate, periodic acid, potassium periodate and the like, among which there are preferred at least one kind selected from among hydrogen peroxide, persulfuric acid and persulfuric acid salt from the viewpoint of more excellent polishing speed. These oxidizing agents may be used alone or in combinations of two or more.

The content of the component (E) is preferably at least 0.1 mass % and more preferably at least 0.2 mass % with respect to the total amount of the polishing agent, from the viewpoint of easily obtaining a more satisfactory polishing speed. From the viewpoint of avoiding a situation in which the polishing speed is not increased, or is instead reduced, with excessive addition of component (E), the content of the component (E) is preferably not greater than 20 mass % and more preferably not greater than 15 mass %.

Since the oxidizing agent can sometimes lower the stability of the polishing agent, in cases where the polishing agent must be stored for prolonged periods (such as 1 month or longer) it is preferred to separately store an aqueous solution of the oxidizing agent and a polishing agent material comprising components other than the oxidizing agent, and to combine them just prior to polishing or on the platen during polishing.

(Component (F): Water)

Component (F), as the medium of the polishing agent, is not particularly restricted but is preferably deionized water, ion-exchanged water, ultrapure water or the like. The component (F) content in the polishing agent may be any amount remaining from the content of the other constituent components, and it is not particularly restricted so long as the component is present in the polishing agent.

The polishing agent may further contain materials commonly used in CMP polishing agents, such as dispersing agents or coloring agents, in addition to the components mentioned above, in ranges that do not interfere with the function and effect of the polishing agent.

(Neutralizing Titer)

Depending on the application substrate and purpose, an even higher polishing speed for copper (for example, a polishing speed exceeding 50000 Å/min) is sometimes desirable. In such cases, an inorganic acid is preferably added to the polishing agent of the first embodiment, in an amount such that the amount of potassium hydroxide necessary for pH increase to 4 in the polishing agent comprising at least (A) an inorganic acid, (B) an amino acid, (C) a protective film-forming agent, (D) an abrasive, (E) an oxidizing agent and (F) water (the neutralization titration equivalent of potassium hydroxide for the inorganic acid) is at least 0.10 mol per 1 kg of polishing agent.

The reason for specifying the neutralization titration equivalent of potassium hydroxide for the inorganic acid in the polishing agent of the first embodiment is as follows. Specifically, the copper present in the metal film to be polished by the polishing agent of the first embodiment dissolves in the polishing agent as cations. If the polishing agent has a low additive amount of inorganic acid and no pH buffer action, presumably the hydrogen ions are consumed by dissolution of the copper, thus increasing the pH of the polishing agent and lowering the polishing speed. On the other hand, if a polishing agent used contains a sufficient amount of inorganic acid and has pH buffer action, pH increase is minimized to allow stable polishing even if metal ions such as copper ions are dissolved in large amounts.

The amount of inorganic acid that is required in the polishing agent for this situation will vary somewhat depending on the polishing speed and the flow rate of the polishing agent during polishing, but it is preferably an amount corresponding to at least 0.10 mol/kg, more preferably at least 0.12 mol/kg, even more preferably at least 0.15 mol/kg and especially preferably at least 0.20 mol/kg, as the neutralization titration equivalent of potassium hydroxide. The upper limit for the neutralization titration equivalent of potassium hydroxide may be 2.0 mol/kg, for example.

The neutralization titration equivalent of the polishing agent may be determined in the following manner. Specifically, a "test solution for measurement of neutralizing titer" is prepared, having the composition obtained by removing pH regulators (for example, acidic components such as aqueous hydrochloric acid or alkaline components such as ammonia water) from the polishing agent. Next, 50 milliliters of the test solution is placed in an approximately 100 milliliter-volume beaker, aqueous potassium hydroxide at 20% concentration is added dropwise while stirring at 80 rpm with a stirrer, and the neutralization titration equivalent may be calculated from the additive amount of aqueous potassium hydroxide when the pH value reaches 4.0.

When the composition of the polishing agent is unknown, the composition and concentration of the polishing agent may be determined based on analysis by ion chromatography at a measuring precision of at least $10^{-8}$ g. Thus, the test solution may be prepared based on this measured value and the neutralizing titer measured.

It has been confirmed that high-speed polishing can be accomplished using the polishing agent described above, for example, with an 8-inch (20.3 cm) disc-shaped substrate and the polishing agent flow rate set to near 200 ml/min. The "neutralization titration equivalent of potassium hydroxide for the inorganic acid" is defined as the number of moles of potassium hydroxide required to increase the pH of the test solution to 4, when 1 kg of test solution is separately prepared having the composition obtained by removing the alkaline components and below-mentioned organic acids from the polishing agent.

Second Embodiment

The polishing agent for copper polishing according to the second embodiment (hereunder referred to simply as "polishing agent") satisfies condition (ii) above. Specifically, the polishing agent of the second embodiment comprises (A) an inorganic acid, (B) an amino acid, (C) a protective film-forming agent, (D) an abrasive, (E) an oxidizing agent, (F) water and (G) at least one kind selected from among organic acids and their acid anhydrides, wherein the content of the component (A) is at least 0.08 mol/kg, the content of the component (B) is at least 0.20 mol/kg and the content of the component (C) is at least 0.02 mol/kg.

In the polishing agent of the second embodiment, the proportion of the content of the component (A) (mol/kg) with respect to the content of the component (C) (mol/kg) does not necessarily need to be 2.00 or greater. A polishing agent of the second embodiment in which the proportion is 2.00 or greater, will be explained below as a polishing agent according to the third embodiment.

Although some improvement in polishing speed can be achieved by using component (A), component (B) and component (G) alone, or two selected therefrom, this does not provide an improving effect on polishing speed that is commensurate with the content. On the other hand, according to the polishing agent of the second embodiment, drastic improvement in the polishing speed of the polishing agent can be achieved by using component (A), component (B) and component (G) in combination while adjusting their contents to the specific contents mentioned above.

From another standpoint, the polishing agent of the second embodiment exhibits an effect which allows reduction in the total content of chemical components required to obtain a given improving effect on polishing speed, compared to using either component (A), component (B) or component (G) alone or two selected therefrom. Moreover, while the storage stability of a conventional polishing agent is reduced if the polishing agent contains at least one kind selected from among component (A), component (B) and component (G) at above the soluble content, the polishing agent of the second embodiment can minimize such reduction in storage stability.

Also, in conventional polishing agents, the use of a protective film-forming agent as component (C) has provided an effect of inhibiting etching of copper, by formation of a protective film on the copper surface, but in most cases this has interfered with the polishing speed. In contrast, the polishing agent of the second embodiment, which employs a combination of prescribed amounts of component (A), component (B) and component (G), with the use of a specific amount of component (C), can exhibit an effect of maintaining a high level of polishing speed while minimizing the etching rate.

While the reason for the effect of improved polishing speed by the polishing agent of the second embodiment is not completely understood, the present inventors conjecture as follows. That is, the effect of component (A), component (C) and component (G) results in formation of a "reaction layer" comprising component (C) and copper ion on the copper surface. Also, chelation of component (B) to the copper ion presumably renders the reaction layer more removable, so that polishing is promoted.

It is believed that such multiple polishing processes do not proceed simultaneously and independently in parallel, but rather each individual polishing process proceeds in linkage with another polishing process. Thus, if one of component (A), component (B), component (C) and component (G) is increased, the polishing process depending on the other components is the bottleneck (rate-determining step), and the overall polishing speed is not effectively increased. On the other hand, presumably by employing prescribed amounts of component (A), component (B), component (C) and component (G) as in the polishing agent of the second embodiment, each polishing process can be promoted and the polishing speed can be efficiently increased.

Each of the constituent components of the polishing agent of the second embodiment will now be explained in detail. For the polishing agent of the second embodiment, only the differences from the polishing agent of the first embodiment will be explained, while explanation of the identical aspects will be omitted.

(Component (G): Organic Acids and their Acid Anhydrides)

The polishing agent of the second embodiment contains at least one kind selected from among organic acids and their acid anhydrides as component (G). Examples for component (G) include at least one kind selected from among organic acids such as formic acid, acetic acid, glyoxylic acid, pyruvic acid, lactic acid, mandelic acid, vinylacetic acid, 3-hydroxybutyric acid, oxalic acid, maleic acid, malonic acid, methylmalonic acid, dimethylmalonic acid, phthalic acid, tartaric acid, fumaric acid, malic acid, succinic acid, glutaric acid, oxaloacetic acid, citric acid, hemimellitic acid, trimellitic acid, trimesic acid, mellitic acid, isocitric acid, aconitic acid, oxalosuccinic acid, propionic acid, butyric acid, isobutyric acid, valeric acid, isovaleric acid, pivalic acid, caproic acid, octanoic acid, adipic acid, pimelic acid, suberic acid, azelaic acid, sebacic acid, acrylic acid, propiolic acid, methacrylic acid, crotonic acid, isocrotonic acid, benzoic acid, cinnamic acid, isophthalic acid, terephthalic acid, furancarboxylic acid, thiophenecarboxylic acid, nicotinic acid, isonicotinic acid, glycolic acid, salicylic acid, creosotic acid, vanillic acid, syringic acid, pyrocatechuic acid, resorcylic acid, gentisic acid, procatechuic acid, orsellinic acid, gallic acid, tartronic acid, leucinic acid, mevalonic acid, pantoic acid, ricinolic acid, ricinelaidic acid, cerebronic acid, citramalic acid, quinic acid, shikimic acid, mandelic acid, benzilic acid, atrolactic acid, melilotic acid, phloretic acid, coumaric acid, umbellic acid, caffeic acid, ferulic acid, isoferulic acid and sinapic acid, and acid anhydrides of organic acids such as maleic anhydride, propionic anhydride, succinic anhydride and phthalic anhydride. Excluded for component (G) are the amino acids of component (B).

Component (G) is preferably at least one kind selected from among organic acids with two carboxyl groups and pKa values of not greater than 2.7, their acid anhydrides, and organic acids with 3 or more carboxyl groups. By using such compounds as component (G), it is possible to obtain an even higher polishing speed by reinforcing the interaction with copper to accomplish effective chelation with the copper ions.

The organic acid with 2 carboxyl groups that is used may be any substances known in the prior art without any particular restrictions, so long as it has sufficient water solubility to exhibit an effect. The pKa of the organic acid with 2 carboxyl groups is not greater than 2.7, preferably not greater than 2.6 and more preferably not greater than 2.5. For the "pKa" value, reference may be made to Kagaku Binran, Kisohen II (5th Revision, Maruzen).

Examples of organic acids with 2 carboxyl groups and pKa values of not greater than 2.7 include oxalic acid, maleic acid, malonic acid and oxaloacetic acid. Examples of acid anhydrides of organic acids with 2 carboxyl groups and pKa values of not greater than 2.7 include maleic anhydride. Preferred among these organic acids and acid anhydrides are oxalic acid, maleic acid, malonic acid and maleic anhydride, from the viewpoint of allowing even greater increase in polishing speed by CMP.

Examples of organic acids with 3 or more carboxyl groups include citric acid, hemimellitic acid, trimellitic acid, trimesic acid, mellitic acid, isocitric acid, aconitic acid, oxalosuccinic acid and the like. Of these, citric acid is preferred from the viewpoint of allowing even more excellent polishing speed for copper, and of minimizing polishing cloth coloration after polishing.

These organic acids and acid anhydrides may be used alone or in combinations of two or more.

The content of the component (G) is preferably at least 0.02 mol/kg and more preferably at least 0.03 mol/kg with respect to the total amount of the polishing agent, from the viewpoint of more excellent polishing speed. The content of the component (G) is preferably not greater than 1.0 mol/kg and more preferably not greater than 0.8 mol/kg from the viewpoint of inhibiting increase in the content of the component (G), since a polishing speed tends not to increase even if component (G) is added in greater than a certain amount.

(Neutralizing Titer)

Depending on the application substrate and purpose, an even higher polishing speed for copper (for example, a polishing speed exceeding 50000 Å/min) is sometimes desirable. In such cases, an inorganic acid is preferably added to the polishing agent of the second embodiment, in an amount such that the amount of potassium hydroxide necessary for pH increase to 4 in the composition obtained by removing component (G) from the polishing agent (the neutralization titration equivalent of potassium hydroxide for the inorganic acid) is at least 0.10 mol per 1 kg of the composition.

The neutralization titration equivalent of the polishing agent containing an organic acid may be determined in the following manner. Specifically, a "test solution for measurement of neutralizing titer" is prepared, having the composition obtained by removing organic acids and pH regulators (for example, acidic components such as aqueous hydrochloric acid or alkaline components such as ammonia water) from the polishing agent. Next, 50 milliliters of the test solution is placed in an approximately 100 milliliter-volume beaker, aqueous potassium hydroxide at 20% concentration is added dropwise while stirring at 80 rpm with a stirrer, and the neutralization titration equivalent may be calculated from the additive amount of aqueous potassium hydroxide when the pH value reaches 4.0. The reasons for specifying the neutralization titration equivalent of potassium hydroxide for the inorganic acid, as well as the neutralization titration equivalent of potassium hydroxide, are the same as for the first embodiment.

Third Embodiment

The polishing agent for copper polishing according to the third embodiment (hereunder referred to simply as "polishing agent") satisfies both conditions (i) and (ii) above. Specifically, the polishing agent according to the third embodiment comprises (A) an inorganic acid, (B) an amino acid, (C) a protective film-forming agent, (D) an abrasive, (E) an oxidizing agent, (F) water and (G) at least one kind selected from among organic acids and their acid anhydrides, wherein the content of the component (A) is at least 0.08 mol/kg, the content of the component (B) is at least 0.20 mol/kg, the content of the component (C) is at least 0.02 mol/kg, and the proportion of the content of the component (A) with respect to the content of the component (C) is 2.00 or greater.

The present inventors have found that in a polishing agent comprising component (G) which is at least one kind selected from among organic acids with 2 carboxyl groups and pKa values of not greater than 2.7, their acid anhydrides, and organic acids with 3 or more carboxyl groups, component (A), component (B) and component (C) (hereunder these four components will also be collectively referred to as "chemical components"), limiting the types and contents of the chemical components can yield a polishing agent that allows higher-speed and smooth polishing of copper. Specifically, the present inventors have found that by increasing the content of each of the chemical components (for example, to approximately twice the conventional amounts) while using at least one kind selected from among specific organic acids and their acid anhydrides, the polishing speed for copper is increased above the expected level while maintaining smoothness.

That is, in the polishing agent of the third embodiment, component (G) is preferably at least one kind selected from among organic acids with two carboxyl groups and pKa values of not greater than 2.7, their acid anhydrides, and organic acids with 3 or more carboxyl groups while the aforementioned ranges are specified for the contents of the component (A), component (B) and component (C), and the proportion of the content of the component (A) with respect to the content of the component (C).

The other constituent components of the polishing agent of the third embodiment are the same as the polishing agent of the first and second embodiments, and will not be repeated here. The neutralization titration equivalent of potassium hydroxide is measured in the same manner as for the second embodiment.

(Polishing Agent Storage Method)

There are no particular restrictions on the method of storing the polishing agent of each of the embodiments described above. For example, it may be stored as a one-pack type polishing agent containing all of the constituent components, or it may be stored as a two-pack type polishing agent wherein the constituent components of the polishing agent are separated into at least a slurry (first solution) and an addition solution (second solution), so that they are mixed together to obtain a CMP polishing agent for each embodiment. When the first embodiment is a two-pack type polishing agent, it may be separated into, for example, a slurry containing (D) an abrasive and (F) water, and an addition solution containing (A) an inorganic acid, (B) an amino acid, (C) a protective film-forming agent and (F) water. The (E) oxidizing agent is added during mixture of the slurry and the addition solution. Storing the slurry and additive without mixing allows the storage stability of the polishing agent to be improved, and further minimizes reduction in polishing speed to allow polishing at a stable polishing speed.

(Polishing Method)

The polishing method of this embodiment characteristically comprises polishing a copper-containing metal film using a polishing agent according to each of the embodiments described above to remove at least a portion of the metal film. More specifically, the polishing method of this embodiment characteristically comprises a lamination step in which a copper-containing metal film is laminated on a substrate, and a polishing step in which a polishing agent according to each of the embodiments described above is used for polishing of the copper-containing metal film to remove at least a portion of the metal film. Here, the "copper-containing metal film" may be a metal film composed of pure copper, a copper-containing metal film (for example, a copper alloy film) or a laminated film comprising such a metal film with another metal.

The polishing agent of each of the embodiments described above characteristically has much higher polishing speeds for copper-containing metal films compared to conventional polishing agents for copper polishing, and for example, they are especially suitable for use of polishing thick metal films in processes for production of high performance and microcircuit boards, as exemplified by package boards such as LSIs. More specifically, they may be especially suitable for use of polishing substrates on which the thicknesses of the metal films containing copper to be polished is 4 µm or greater, for example. Since high polishing speed and smooth polishing are both accomplished by the polishing agent of each of the embodiments described above, they can be suitably applied for metal films wherein the maximum thickness of the metal film is 5 µm or greater, and especially 10 µm or greater.

A Through Silicon Via (TSV)-forming step may be mentioned as a step necessary for polishing of very thick metal films. Various methods have been proposed as methods of forming TSV, and a specific method is VIA-LAST, wherein vias are formed after forming the element. A method of using the polishing agent of each of the aforementioned embodiments in VIA-LAST will now be explained with reference to the process drawings (schematic cross-sectional views) of FIGS. 1 to 3.

FIG. 1 is a schematic cross-sectional view showing a step of forming a copper layer 4 on a silicon substrate 1. As shown in FIG. 1(a), an element 2 is formed at a prescribed location of the silicon substrate 1. Next, as shown in FIG. 1(b), a concave portion 3 for a through via is formed by a method such as plasma etching. Next, copper is laminated by a method such as sputtering or electrolytic plating so as to fill the concave portion 3, to form a copper layer 4, thereby obtaining a substrate 100 having the structure shown in FIG. 1(c).

Figure 2:
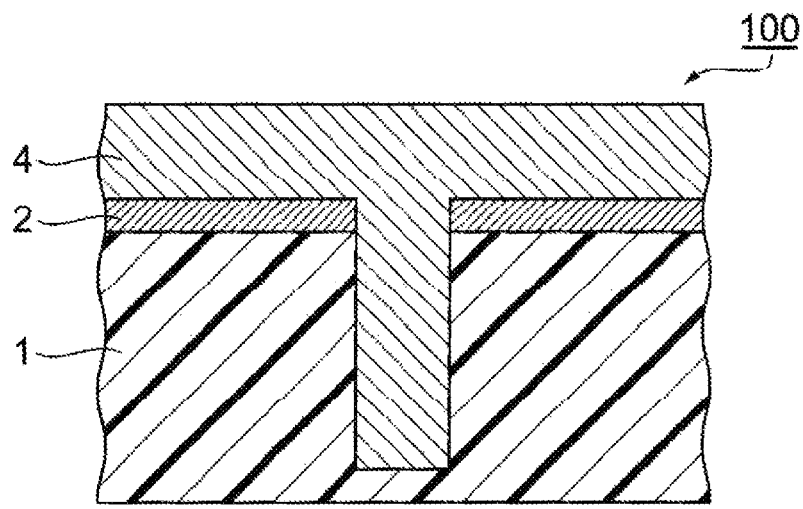
FIGS. 2(a)-(c) are second process drawings that illustrate a method of using a polishing agent according to an embodiment of the invention for VIA-LAST.
Figure 2:
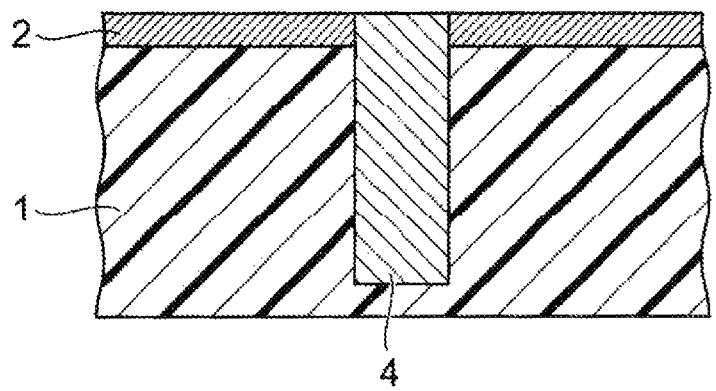
Figure 2:
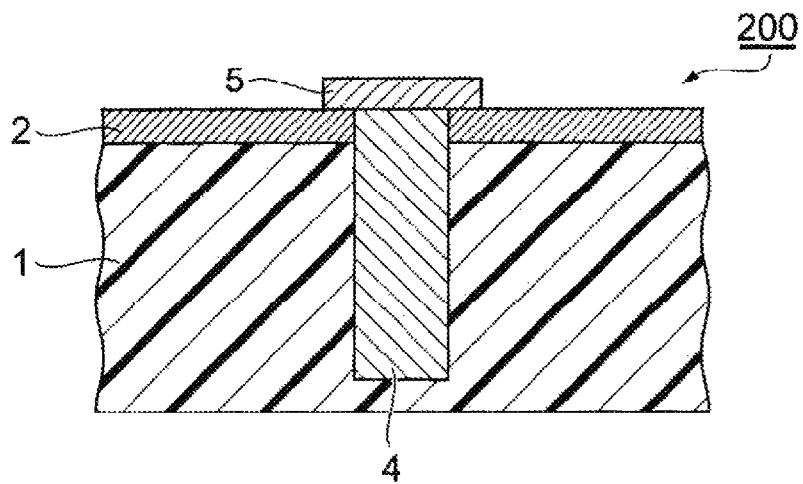

FIG. 2 is a schematic cross-sectional view showing a step of polishing a substrate 100 formed in this manner and forming a bump 5 on one side. The polishing agent is supplied between the surface of the copper layer 4 in FIG. 2(a) and a polishing cloth (not shown), while the copper layer 4 is polished to expose the element 2, as shown in FIG. 2(b).

More specifically, the polishing agent is supplied between the copper layer 4 of the substrate 100 and the surface of the polishing cloth of a platen, while the copper layer 4 is polished by relative movement between the platen and the substrate 100 with the copper layer 4 of the substrate 100 pressed against the surface of the polishing cloth. A metal or resin brush may be used instead of a polishing cloth. The polishing may also be accomplished by spraying the polishing agent at a prescribed pressure.

In the case of polishing with a polishing cloth, for example, the polishing apparatus used may be a common polishing apparatus having a platen that is connected to a motor or the like with variable rotational speed and that can mount the polishing cloth, and a holder capable of holding the substrate to be polished. There are no particular restrictions on the material of the polishing cloth, and a common nonwoven fabric, foamed polyurethane, porous fluorine resin or the like may be used.

The polishing conditions are not restricted, but the rotational speed of the platen is preferably low, at not higher than 200 rpm, to prevent fly off of the substrate. The pressure with which the substrate having the surface to be polished is pressed against the polishing cloth (polishing pressure) is preferably 1-100 kPa, and it is more preferably 5-50 kPa to satisfy the uniformity of CMP speed within the polished surface, and smoothness of the pattern. During the polishing, the polishing agent is continuously supplied to the polishing cloth with a pump or the like. The amount supplied is not restricted, but preferably the surface of the polishing cloth is covered by the polishing agent at all times.

Upon completion of polishing, preferably, the substrate is thoroughly rinsed in running water, and then it is dried after using spin drying or the like to remove the water droplets adhering to the substrate. For CMP with a consistent surface condition of the polishing cloth, it is preferred to include a polishing cloth-conditioning step before polishing. For example, the polishing cloth is conditioned with a solution containing at least water, using a dresser with diamond particles. A CMP polishing step is then carried out by the polishing method of this embodiment, and preferably a substrate-washing step is added.

Next, as shown in FIG. 2(c), the exposed surface portion of the copper layer 4 is subjected to electrolytic plating or the like to form a bump 5, to obtain a substrate 200 having a bump 5 on one side. The material of the bump 5 may be copper or the like.

Figure 3:
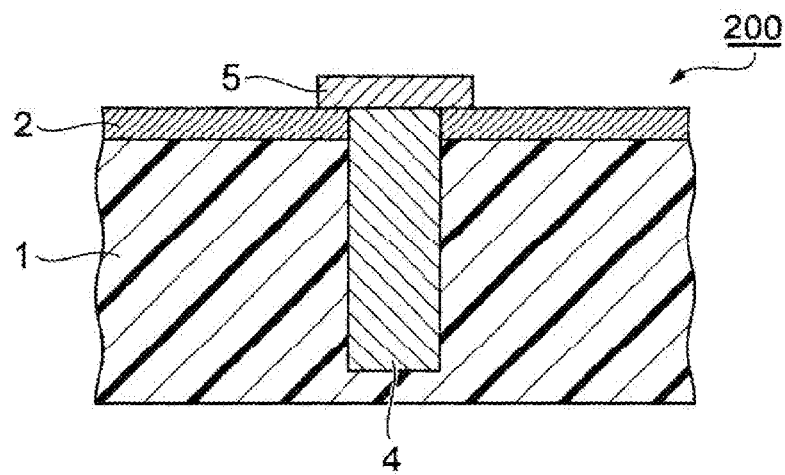
FIGS. 3(a)-(c) are third process drawings that illustrate a method of using a polishing agent according to an embodiment of the invention for VIA-LAST.
Figure 3:
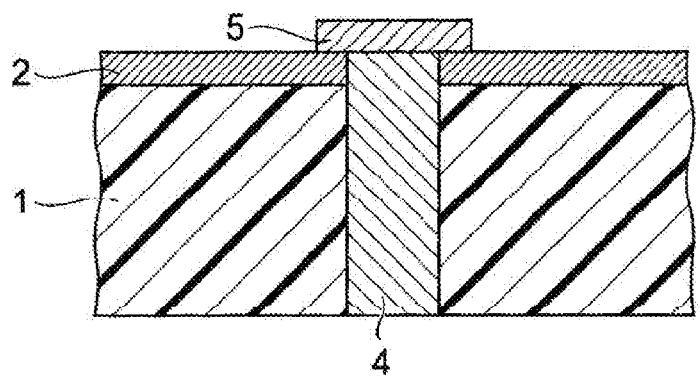
Figure 3:
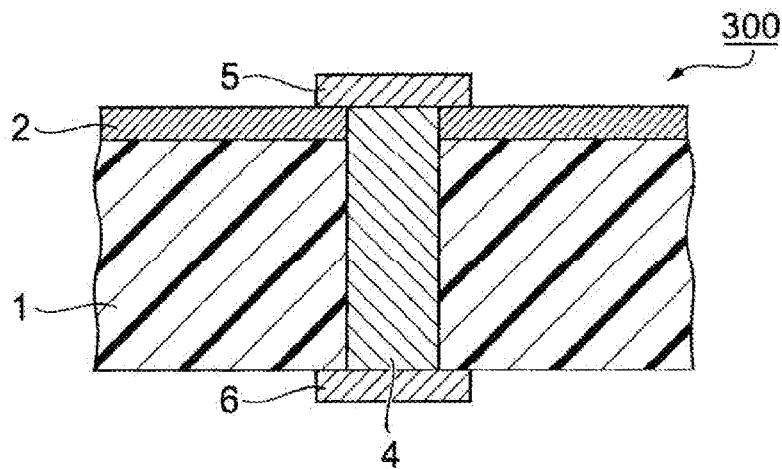

FIG. 3 is a schematic cross-sectional view showing a step of forming a bump 6 on the other side. In the substrate 200 as shown in FIG. 3(a), the side of the silicon substrate 1 on which the bump 5 is not formed (the side opposite the side on which the bump 5 is formed) is polished by a method such as CMP to expose the copper layer 4 (FIG. 3(b)). Next, a bump 6 is formed by the same method as the method used to form the bump 5, to obtain a substrate 300 with a TSV formed thereon (FIG. 3(c)).

EXAMPLES

The present invention will now be explained in greater detail through the following examples (experimental examples), with the understanding that these examples are in no way limitative on the invention. Unless otherwise specified, the "%" values refer to "mass %".

Experimental Examples 1-1 to 1-11

Preparation of Polishing Agents

Polishing agents of Experimental Examples 1-1 to 1-11 will now be described. Experimental Examples 1-7 and 1-8 correspond to the first embodiment of the invention, Experimental Example 1-6 corresponds to the second embodiment of the invention, and Experimental Examples 1-1 to 1-5 and 1-9 correspond to the third embodiment of the invention.

Experimental Example 1-1

To 550 g of water there were added 10 g of sulfuric acid at 96% concentration, 10 g of phosphoric acid at 85% concentration, 50 g of glycine, 10 g of benzotriazole (BTA), 10 g of oxalic acid and 50 g of colloidal silica with a mean particle size of 70 nm (solid content: 20%) prepared by hydrolysis of tetraethoxysilane in an ammonia solution, and the components other than colloidal silica were dissolved. There was further added 25% ammonia aqueous solution to adjust the pH of the solution to 2.6, and then purified water was further added to a total amount of 700 g. To this there was added 300 g of hydrogen peroxide water (reagent grade, 30% aqueous solution) to obtain polishing agent 1-1 with a total amount of 1000 g.

Experimental Example 1-2

Polishing agent 1-2 was prepared in the same manner as Experimental Example 1-1, except that 10 g of malonic acid was added instead of oxalic acid.

Experimental Example 1-3

Polishing agent 1-3 was prepared in the same manner as Experimental Example 1-1, except that 10 g of maleic acid was added instead of oxalic acid.

Experimental Example 1-4

Polishing agent 1-4 was prepared in the same manner as Experimental Example 1-1, except that 50 g of alanine was added instead of glycine.

Experimental Example 1-5

Polishing agent 1-5 was prepared in the same manner as Experimental Example 1-1, except that 50 g of serine was added instead of glycine.

Experimental Example 1-6

Polishing agent 1-6 was prepared in the same manner as Experimental Example 1-1, except that the additive amounts of sulfuric acid and phosphoric acid were 5 g each.

Experimental Example 1-7

Polishing agent 1-7 was prepared in the same manner as Experimental Example 1-1, except that no oxalic acid was added.

Experimental Example 1-8

Polishing agent 1-8 was prepared in the same manner as Experimental Example 1-1, except that no oxalic acid was added, and the amount of sulfuric acid was increased to 20 g.

Experimental Example 1-9

Polishing agent 1-9 was prepared in the same manner as Experimental Example 1-1, except that malic acid was added instead of oxalic acid.

Experimental Example 1-10

Polishing agent X1-1 was prepared in the same manner as Experimental Example 1-1, except that no sulfuric acid or phosphoric acid was added, and the amount of oxalic acid was 30 g.

Experimental Example 1-11

Polishing agent X1-2 was prepared in the same manner as Experimental Example 1-1, except that the additive amount of sulfuric acid was 1 g, and the additive amount of phosphoric acid was 5 g.

(Measurement of Polishing Agent pH)

The pH values of polishing agents 1-1 to 1-9 and X1-1 to X1-2 were measured using a Model PH81 by Yokogawa Electric Corp. The measured values for the pH are listed in Table 1.

(Measurement of Neutralizing Titer)

Test solutions for measurement of neutralizing titer (test solutions 1-1 to 1-9 and test solutions X1-1 and X1-2) were prepared in the same manner as Experimental Examples 1-1 to 1-11, except that no organic acid and 25% ammonia aqueous solution was added. The neutralization titration equivalent for each test solution was measured with potassium hydroxide using a pH meter (Model PH81 by Yokogawa Electric Corp.), in a thermobath at 25° C. For Experimental Example 1-10, the pH exceeded 4.0 without addition of oxalic acid or ammonia aqueous solution, and therefore the neutralizing titer was recorded as 0 (mol/kg).

The neutralization titration equivalent was determined in the following manner. Specifically, 50 milliliters of the test solution was placed in a 100 milliliter-volume beaker, aqueous potassium hydroxide at 20% concentration was added dropwise while stirring at 80 rpm with a stirrer, and the neutralization titration equivalent was calculated from the additive amount of aqueous potassium hydroxide when the pH value reached 4.0.

(Polishing of Substrate)

A substrate (purchased from Advantech, Inc.) comprising a 20 μm-thick copper film formed on a silicon substrate with an 8-inch diameter (20.3 cm)(φ) was prepared. The substrate was used for CMP polishing while adding one of the polishing agents 1-1 to 1-9 and polishing agents X1-1 and X1-2 dropwise to a polishing cloth attached to the platen of the polishing apparatus.

The polishing conditions were as follows.
Polishing apparatus: Platen dimensions of 600 mm(φ) diameter, rotary type.
Polishing cloth: Foamed polyurethane resin with closed cells (IC-1010, Rohm & Haas).
Polishing pressure: 32 kPa
Platen/head rotational speed: 93/87 rpm
Polishing agent flow rate: 200 ml/min (Evaluated Properties and Evaluation Methods)

The substrates polished as described above were used for measurement of the copper polishing speed by CMP (hereunder referred to simply as "polishing speed") and the surface roughness.

Polishing speed: The difference in film thickness before and after CMP of the substrate was determined by calculating the change in sheet resistance. The measuring apparatus used was a Model RT-7 resistivity meter by Napson Corp. The resistance value used was the average value of 77 points in the diameter direction of the wafer (excluding the sections 5 mm from the edges).

Surface roughness (arithmetic mean roughness: Ra): The surface roughness of the copper film after polishing was measured with an AFM (Atomic Force Microscope: SPA-400 by SII Nanotechnology, Inc.). The measurement was conducted at a location 50 mm distant from the center of the substrate in the radial direction, with an area range of 5 μm×5 μm.

Table 1 shows the constituent components of polishing agents 1-1 to 1-9 and X1-1 and X1-2, and the pH value, the neutralization titration equivalent of potassium hydroxide and the polishing test evaluation results, for each polishing agent. The "Chemical component total" in the table is the total of the contents of the component (A), component (B), component (C) and component (G).

TABLE 1

| Component name | Substance name | Concentration | Formula weight | Experimental Example 1-1 | 1-2 | 1-3 | 1-4 | 1-5 | 1-6 |
|---|---|---|---|---|---|---|---|---|---|
| (D) Abrasive | Colloidal silica | — | g/kg | 10 | 10 | 10 | 10 | 10 | 10 |
| | | — | mass % | 1 | 1 | 1 | 1 | 1 | 1 |
| (A) Inorganic acids | Sulfuric acid | 96% | g/kg | 10 | 10 | 10 | 10 | 10 | 5 |
| | | 98.08 | mol/kg | 0.098 | 0.098 | 0.098 | 0.098 | 0.098 | 0.049 |
| | Phosphoric acid | 85% | g/kg | 10 | 10 | 10 | 10 | 10 | 5 |
| | | 98.00 | mol/kg | 0.087 | 0.087 | 0.087 | 0.087 | 0.087 | 0.043 |
| (B) Amino acids | Glycine | 100% | g/kg | 50 | 50 | 50 | — | — | 50 |
| | | 75.07 | mol/kg | 0.666 | 0.666 | 0.666 | — | — | 0.666 |
| | Alanine | 100% | g/kg | — | — | — | 50 | — | — |
| | | 89.09 | mol/kg | — | — | — | 0.561 | — | — |
| | Serine | 100% | g/kg | — | — | — | — | 50 | — |
| | | 105.09 | mol/kg | — | — | — | — | 0.476 | — |
| (C) Protective film-forming agent | BTA | 100% | g/kg | 10 | 10 | 10 | 10 | 10 | 10 |
| | | 119.13 | mol/kg | 0.084 | 0.084 | 0.084 | 0.084 | 0.084 | 0.084 |
| (G) Organic acids | Oxalic acid | 100% | g/kg | 10 | — | — | 10 | 10 | 10 |
| | | 90.03 | mol/kg | 0.111 | — | — | 0.111 | 0.111 | 0.111 |
| | Malonic acid | 100% | g/kg | — | 10 | — | — | — | — |
| | | 104.06 | mol/kg | — | 0.096 | — | — | — | — |
| | Maleic acid | 100% | g/kg | — | — | 10 | — | — | — |
| | | 116.07 | mol/kg | — | — | 0.086 | — | — | — |
| | Malic acid | 100% | g/kg | — | — | — | — | — | — |
| | | 134.09 | mol/kg | — | — | — | — | — | — |
| (E) Oxidizing agent | Hydrogen peroxide | — | mass % | 9.00 | 9.00 | 9.00 | 9.00 | 9.00 | 9.00 |
| pH regulators | Ammonia water | — | — | q.s. | q.s. | q.s. | q.s. | q.s. | q.s. |
| | Hydrochloric acid | — | — | — | — | — | — | — | — |
| | Component (A) total | | mol/kg | 0.185 | 0.185 | 0.185 | 0.185 | 0.185 | 0.092 |
| | Component (B) total | | mol/kg | 0.666 | 0.666 | 0.666 | 0.561 | 0.476 | 0.666 |
| | Component (C) total | | mol/kg | 0.084 | 0.084 | 0.084 | 0.084 | 0.084 | 0.084 |

TABLE 1-continued

| Component name | Substance name | Formula weight | Concentration | | | | | |
|---|---|---|---|---|---|---|---|---|
| Component (G) total | | | mol/kg | 0.111 | 0.096 | 0.086 | 0.111 | 0.111 | 0.111 |
| Chemical component total | | | mol/kg | 1.046 | 1.031 | 1.021 | 0.941 | 0.856 | 0.953 |
| Component (A)/Component (C) (mol ratio) | | | | 2.20 | 2.20 | 2.20 | 2.20 | 2.20 | 1.10 |
| pH | | | | 2.4 | 2.4 | 2.4 | 2.4 | 2.4 | 2.4 |
| KOH titer of composition without component (G) | | | mol/kg | 0.28 | 0.28 | 0.28 | 0.28 | 0.28 | 0.14 |
| Polishing speed | | | Å/min | 60000 | 54000 | 58000 | 54000 | 61000 | 40000 |
| Surface roughness | | | nm | 1.1 | 1.1 | 0.9 | 1.0 | 1.2 | 1.2 |

| Component name | Substance name | Formula weight | Concentration | Experimental Example | | | | |
|---|---|---|---|---|---|---|---|---|
| | | | | 1-7 | 1-8 | 1-9 | 1-10 | 1-11 |
| (D) Abrasive | Colloidal silica | — | g/kg | 10 | 10 | 10 | 10 | 10 |
| | | — | mass % | 1 | 1 | 1 | 1 | 1 |
| (A) Inorganic acids | Sulfuric acid | 96% | g/kg | 10 | 20 | 10 | — | 1 |
| | | 98.08 | mol/kg | 0.098 | 0.196 | 0.098 | — | 0.010 |
| | Phosphoric acid | 85% | g/kg | 10 | 10 | 10 | — | 5 |
| | | 98.00 | mol/kg | 0.087 | 0.087 | 0.087 | — | 0.043 |
| (B) Amino acids | Glycine | 100% | g/kg | 50 | 50 | 50 | 50 | 50 |
| | | 75.07 | mol/kg | 0.666 | 0.666 | 0.666 | 0.666 | 0.666 |
| | Alanine | 100% | g/kg | — | — | — | — | — |
| | | 89.09 | mol/kg | — | — | — | — | — |
| | Serine | 100% | g/kg | — | — | — | — | — |
| | | 105.09 | mol/kg | — | — | — | — | — |
| (C) Protective film-forming agent | BTA | 100% | g/kg | 10 | 10 | 10 | 10 | 10 |
| | | 119.13 | mol/kg | 0.084 | 0.084 | 0.084 | 0.084 | 0.084 |
| (G) Organic acids | Oxalic acid | 100% | g/kg | — | — | — | 30 | 10 |
| | | 90.03 | mol/kg | — | — | — | 0.333 | 0.111 |
| | Malonic acid | 100% | g/kg | — | — | — | — | — |
| | | 104.06 | mol/kg | — | — | — | — | — |
| | Maleic acid | 100% | g/kg | — | — | — | — | — |
| | | 116.07 | mol/kg | — | — | — | — | — |
| | Malic acid | 100% | g/kg | — | — | 10 | — | — |
| | | 134.09 | mol/kg | — | — | 0.075 | — | — |
| (E) Oxidizing agent | Hydrogen peroxide | — | mass % | 9.00 | 9.00 | 9.00 | 9.00 | 9.00 |
| pH regulators | Ammonia water | — | — | q.s. | q.s. | q.s. | q.s. | q.s. |
| | Hydrochloric acid | — | — | — | — | — | — | — |
| Component (A) total | | | mol/kg | 0.185 | 0.283 | 0.185 | — | 0.053 |
| Component (B) total | | | mol/kg | 0.666 | 0.666 | 0.666 | 0.666 | 0.666 |
| Component (C) total | | | mol/kg | 0.084 | 0.084 | 0.084 | 0.084 | 0.084 |
| Component (G) total | | | mol/kg | — | — | 0.075 | 0.333 | 0.111 |
| Chemical component total | | | mol/kg | 0.935 | 1.033 | 1.010 | 1.083 | 0.914 |
| Component (A)/Component (C) (mol ratio) | | | | 2.20 | 3.37 | 2.20 | — | 0.63 |
| pH | | | | 2.4 | 2.4 | 2.4 | 2.4 | 2.4 |
| KOH titer of composition without component (G) | | | mol/kg | 0.28 | 0.50 | 0.28 | — | 0.07 |
| Polishing speed | | | Å/min | 35000 | 37000 | 37000 | 11000 | 12000 |
| Surface roughness | | | nm | 1.1 | 2.4 | 1.2 | 1.4 | 1.3 |

The following conclusions may be drawn from the results in Table 1. Specifically, the polishing agents of Experimental Examples 1-1 to 1-9 exhibited satisfactory polishing speed and surface roughness.

Polishing agent 1-1 of Experimental Example 1-1, having a composition with oxalic acid added to the polishing agent of Experimental Example 1-7, had a higher polishing speed while maintaining surface roughness, compared to Experimental Example 1-7.

Polishing agent X1-1 of Experimental Example 1-10, having the composition of the polishing agent of Experimental Example 1-1 with sulfuric acid and phosphoric acid replaced by oxalic acid, had drastically reduced polishing speed compared to Experimental Example 1-1, although surface roughness was maintained.

Polishing agent 1-1 of Experimental Example 1-1, having the composition of the polishing agent of Experimental Example 1-8 with a portion of the sulfuric acid replaced by oxalic acid, had increased surface roughness and polishing speed compared to Experimental Example 1-8. Experimental Example 1-8 had a speed of greater than 30000 Å/min, similar to Experimental Example 1-7.

In regard to polishing speed, a polishing speed of 37000 Å/min was achieved with the polishing agent of Experimental Example 1-8, in which an additional 10 g of sulfuric acid was added to Experimental Example 1-7, while a polishing speed of 60000 Å/min was achieved with the polishing agent of Experimental Example 1-1, which was a system with addition of 10 g of oxalic acid to Experimental Example 1-7. It was thus possible to confirm that combination of component (A) and component (G) is effective for improving the polishing speed.

Because of the low amount of component (A) compared to polishing agent 1-1 of Experimental Example 1-1, polishing agent X1-2 of Experimental Example 1-11, which had a neutralization titration equivalent of below 0.10 mol/kg, had a drastically reduced polishing speed compared to Experimental Example 1-1.

On the other hand, polishing agent 1-1 of Experimental Example 1-1, which had the same type of component (A) and amounts of component (A) and component (G) as Experimental Example 1-9 but had a component (G) pKa of not more than 2.7, exhibited increased polishing speed while maintaining surface roughness, compared to Experimental Example 1-9.

This indicates that optimizing the amounts and combination of component (A) and component (G) can yield a polishing agent that exhibits a markedly higher polishing speed for copper than common polishing agents, while maintaining low surface roughness. In particular, a polishing agent with a polishing speed exceeding 30000 Å/min and more preferably 50000 Å/min for copper is optimal for rapid polishing of large amounts of copper, for formation of TSV, for example.

Experimental Examples 2-1 to 2-14

Preparation of Polishing Agents

Polishing agents of Experimental Examples 2-1 to 2-14 will now be described. Experimental Examples 2-1 to 2-4 correspond to the first embodiment described above.

Experimental Example 2-1

To 600 g of purified water there were added 5.1 g of sulfuric acid at a concentration 96%, 5.8 g of phosphoric acid at a concentration 85%, 20.3 g of glycine, 4.0 g of benzotriazole (BTA) and 50 g of colloidal silica with a mean particle size of 70 nm (solid content: 20%) prepared by hydrolysis of tetra-ethoxysilane in an ammonia solution, as an abrasive, and the components other than colloidal silica were dissolved. There was further added 25% ammonia aqueous solution to adjust the pH of the solution to 2.6, and then purified water was further added to a total amount of 700 g. To this there was added 300 g of hydrogen peroxide water (reagent grade, 30% aqueous solution) to obtain polishing agent 2-1 with a total amount of 1000 g.

Experimental Example 2-2

Polishing agent 2-2 was prepared in the same manner as Experimental Example 2-1, except that the amount of sulfuric acid was 7.7 g, the amount of phosphoric acid was 8.6 g, the amount of glycine was 30.8 g and the amount of benzotriazole was 6.0 g.

Experimental Example 2-3

Polishing agent 2-3 was prepared in the same manner as Experimental Example 2-1, except that the amount of sulfuric acid was 10.2 g, the amount of phosphoric acid was 11.5 g, the amount of glycine was 40.5 g and the amount of benzotriazole was 8.0 g.

Experimental Example 2-4

Polishing agent 2-4 was prepared in the same manner as Experimental Example 2-1, except that 28.4 g of serine was used instead of glycine.

Experimental Example 2-5

Polishing agent X2-1 was prepared in the same manner as Experimental Example 2-1, except that the amount of sulfuric acid was 2.6 g, the amount of phosphoric acid was 2.9 g, the amount of glycine was 10.5 g and the amount of benzotriazole was 2.0 g.

Experimental Example 2-6

Polishing agent X2-2 was prepared in the same manner as Experimental Example 2-1, except that the amount of glycine was 10.5 g and the amount of benzotriazole was 2.0 g.

Experimental Example 2-7

Polishing agent X2-3 was prepared in the same manner as Experimental Example 2-1, except that the amount of sulfuric acid was 10.2 g, the amount of phosphoric acid was 11.5 g, the amount of glycine was 10.5 g and the amount of benzotriazole was 2.0 g.

Experimental Example 2-8

Polishing agent X2-4 was prepared in the same manner as Experimental Example 2-1, except that amount of sulfuric acid was 2.6 g, the amount of phosphoric acid was 2.9 g, the amount of benzotriazole was 2.0 g, and 36% hydrochloric acid was used instead of ammonia aqueous solution for pH adjustment.

Experimental Example 2-9

Polishing agent X2-5 was prepared in the same manner as Experimental Example 2-1, except that the amount of sulfuric acid was 2.6 g, the amount of phosphoric acid was 2.9 g and the amount of glycine was 10.5 g.

Experimental Example 2-10

Polishing agent X2-6 was prepared in the same manner as Experimental Example 2-1, except that the amount of sulfuric acid was 2.6 g, the amount of phosphoric acid was 2.9 g, and 36% hydrochloric acid was used instead of ammonia aqueous solution for pH adjustment.

Experimental Example 2-11

Polishing agent X2-7 was prepared in the same manner as Experimental Example 2-1, except that the amount of glycine was 0 g.

Experimental Example 2-12

Polishing agent X2-8 was prepared in the same manner as Experimental Example 2-1, except that the amount of glycine was 10.5 g and the amount of benzotriazole was 4.0 g.

Experimental Example 2-13

Polishing agent X2-9 was prepared in the same manner as Experimental Example 2-1, except that the amount of benzotriazole was 2.0 g.

Experimental Example 2-14

Polishing agent X2-10 was prepared in the same manner as Experimental Example 2-1, except that the amount of benzotriazole was 8.0 g.

(Measurement of Polishing Agent pH)

The pH values of polishing agents 2-1 to 2-4 and X2-1 to X2-10 were measured using a Model PH81 by Yokogawa Electric Corp. The measured values for the pH are listed in Tables 2 and 3.

(Measurement of Neutralizing Titer)

Test solutions for measurement of neutralizing titer (test solutions 2-1 to 2-4 and test solutions X2-1 to X2-10) were prepared in the same manner as Experimental Examples 2-1 to 2-14, except that no 25% ammonia water was added. The neutralization titration equivalent for each test solution was measured with potassium hydroxide using a pH meter (Model PH81 by Yokogawa Electric Corp.), in a thermobath at 25° C.

The neutralization titration equivalent was determined in the following manner. Specifically, 50 milliliters of the test solution was placed in a 100 milliliter-volume beaker, aqueous potassium hydroxide at 20% concentration was added dropwise while stirring at 80 rpm with a stirrer, and the neutralization titration equivalent was calculated from the additive amount of aqueous potassium hydroxide when the pH value reached 4.0.

(Polishing of Substrate)

A substrate (purchased from Advantech, Inc.) comprising a 20 μm-thick copper film formed on a silicon substrate with an 8-inch diameter (20.3 cm)(φ) was prepared. The substrate was used for CMP polishing while adding one of the polishing agents 2-1 to 2-4 and polishing agents X2-1 to X2-10 dropwise to a polishing cloth attached to the platen of the polishing apparatus.

The polishing conditions were as follows.

Polishing apparatus: Platen dimensions of 600 mm(φ) diameter, rotary type.
Polishing cloth: Foamed polyurethane resin with closed cells (IC-1010, Rohm & Haas).
Polishing pressure: 32 kPa
Platen/head rotational speed: 93/87 rpm
Polishing agent flow rate: 200 ml/min
(Evaluated Properties and Evaluation Methods)

The substrates polished as described above were used for measurement of the copper polishing speed by CMP (hereunder referred to simply as "polishing speed") and the surface roughness.

Polishing speed: The difference in film thickness before and after CMP of the substrate was determined by calculating the change in sheet resistance. The measuring apparatus used was a Model RT-7 resistivity meter by Napson Corp. The resistance value used was the average value of 77 points in the diameter direction of the wafer (excluding the sections 5 mm from the edges).

Surface roughness (arithmetic mean roughness: Ra): The surface roughness of the copper film after polishing was measured with an AFM (Atomic Force Microscope: SPA-400 by SII Nanotechnology, Inc.). The measurement was conducted at a location 50 mm distant from the center of the substrate in the radial direction, with an area range of 5 μm×5 μm.

Tables 2 and 3 show the constituent components of polishing agents 2-1 to 2-4 and X2-1 to X2-10, and the pH value, the neutralization titration equivalent of potassium hydroxide and the polishing test evaluation results, for each polishing agent.

TABLE 2

| Component name | Substance name | Concentration Formula weight | | Experimental Example | | | | | | |
|---|---|---|---|---|---|---|---|---|---|---|
| | | | | 2-1 | 2-2 | 2-3 | 2-4 | 2-5 | 2-6 | 2-7 |
| (D) Abrasive | Colloidal silica | — | g/kg | 10 | 10 | 10 | 10 | 10 | 10 | 10 |
| | | — | mass % | 1 | 1 | 1 | 1 | 1 | 1 | 1 |
| (A) Inorganic acids | Sulfuric acid | 96% | g/kg | 5.1 | 7.7 | 10.2 | 5.1 | 2.6 | 5.1 | 10.2 |
| | | 98.08 | mol/kg | 0.050 | 0.075 | 0.100 | 0.050 | 0.025 | 0.050 | 0.100 |
| | Phosphoric acid | 85% | g/kg | 5.8 | 8.6 | 11.5 | 5.8 | 2.9 | 5.8 | 11.5 |
| | | 98.00 | mol/kg | 0.050 | 0.075 | 0.100 | 0.050 | 0.025 | 0.050 | 0.100 |
| (B) Amino acids | Glycine | 100% | g/kg | 20.3 | 30.8 | 40.5 | — | 10.5 | 10.5 | 10.5 |
| | | 75.07 | mol/kg | 0.270 | 0.410 | 0.540 | — | 0.140 | 0.140 | 0.140 |
| | Serine | 100% | g/kg | — | — | — | 28.4 | — | — | — |
| | | 105.09 | mol/kg | — | — | — | 0.270 | — | — | — |
| (C) Protective film-forming agent | BTA | 100% | g/kg | 4.0 | 6.0 | 8.0 | 4.0 | 2.0 | 2.0 | 2.0 |
| | | 119.13 | mol/kg | 0.034 | 0.050 | 0.067 | 0.034 | 0.017 | 0.017 | 0.017 |
| (G) Organic acids | — | — | g/kg | — | — | — | — | — | — | — |
| | | — | mol/kg | — | — | — | — | — | — | — |
| (E) Oxidizing agent | Hydrogen peroxide | — | mass % | 9.00 | 9.00 | 9.00 | 9.00 | 9.00 | 9.00 | 9.00 |
| pH regulators | Ammonia water | — | — | q.s. | q.s. | q.s. | q.s. | q.s. | q.s. | q.s. |
| | Hydrochloric acid | — | — | — | — | — | — | — | — | — |
| Component (A) total | | | mol/kg | 0.100 | 0.150 | 0.200 | 0.100 | 0.050 | 0.100 | 0.200 |
| Component (B) total | | | mol/kg | 0.270 | 0.410 | 0.540 | 0.270 | 0.140 | 0.140 | 0.140 |
| Component (C) total | | | mol/kg | 0.034 | 0.050 | 0.067 | 0.034 | 0.017 | 0.017 | 0.017 |
| Component (G) total | | | mol/kg | — | — | — | — | — | — | — |
| Chemical component total | | | mol/kg | 0.404 | 0.610 | 0.807 | 0.404 | 0.207 | 0.257 | 0.357 |
| Component (A)/Component (C) (mol ratio) | | | | 2.94 | 3.00 | 2.99 | 2.94 | 2.94 | 5.88 | 11.76 |
| pH | | | | 2.4 | 2.4 | 2.4 | 2.4 | 2.4 | 2.4 | 2.4 |
| KOH titer of composition without component (G) | | | mol/kg | 0.14 | 0.21 | 0.28 | 0.14 | 0.07 | 0.14 | 0.28 |
| Polishing speed | | | Å/min | 32000 | 38000 | 42000 | 31000 | 21000 | 24000 | 22000 |
| Surface roughness | | | nm | 1.1 | 1.3 | 1.4 | 1.1 | 0.9 | 1.4 | 2.4 |

TABLE 3

| Component name | Substance name | Concentration Formula weight | | Experimental Example | | | | | | |
|---|---|---|---|---|---|---|---|---|---|---|
| | | | | 2-8 | 2-9 | 2-10 | 2-11 | 2-12 | 2-13 | 2-14 |
| (D) Abrasive | Colloidal silica | — | g/kg | 10 | 10 | 10 | 10 | 10 | 10 | 10 |
| | | — | mass % | 1 | 1 | 1 | 1 | 1 | 1 | 1 |
| (A) Inorganic acids | Sulfuric acid | 96% | g/kg | 2.6 | 2.6 | 2.6 | 5.1 | 5.1 | 5.1 | 5.1 |
| | | 98.08 | mol/kg | 0.025 | 0.025 | 0.025 | 0.050 | 0.050 | 0.050 | 0.050 |
| | Phosphoric acid | 85% | g/kg | 2.9 | 2.9 | 2.9 | 5.8 | 5.8 | 5.8 | 5.8 |
| | | 98.00 | mol/kg | 0.025 | 0.025 | 0.025 | 0.050 | 0.050 | 0.050 | 0.050 |
| (B) Amino acids | Glycine | 100% | g/kg | 20.3 | 10.5 | 20.3 | — | 10.5 | 20.3 | 20.3 |
| | | 75.07 | mol/kg | 0.270 | 0.140 | 0.270 | — | 0.140 | 0.270 | 0.270 |

TABLE 3-continued

| Component name | Substance name | Concentration Formula weight | | Experimental Example 2-8 | 2-9 | 2-10 | 2-11 | 2-12 | 2-13 | 2-14 |
|---|---|---|---|---|---|---|---|---|---|---|
| | Serine | 100% | g/kg | — | — | — | — | — | — | — |
| | | 105.09 | mol/kg | — | — | — | — | — | — | — |
| (C) Protective film-forming agent | BTA | 100% 119.13 | g/kg mol/kg | 2.0 0.017 | 4.0 0.034 | 4.0 0.034 | 4.0 0.034 | 4.0 0.034 | 2.0 0.017 | 8.0 0.067 |
| (G) Organic acids | — | — | g/kg | — | — | — | — | — | — | — |
| | | — | mol/kg | — | — | — | — | — | — | — |
| (E) Oxidizing agent | Hydrogen peroxide | — | mass % | 9.00 | 9.00 | 9.00 | 9.00 | 9.00 | 9.00 | 9.00 |
| pH regulators | Ammonia water | — | — | — | q.s. | — | q.s. | q.s. | q.s. | q.s. |
| | Hydrochloric acid | — | — | q.s. | — | q.s. | — | — | — | — |
| Component (A) total | | | mol/kg | 0.050 | 0.050 | 0.050 | 0.100 | 0.100 | 0.100 | 0.100 |
| Component (B) total | | | mol/kg | 0.270 | 0.140 | 0.270 | — | 0.140 | 0.270 | 0.270 |
| Component (C) total | | | mol/kg | 0.017 | 0.034 | 0.034 | 0.034 | 0.034 | 0.017 | 0.067 |
| Component (G) total | | | mol/kg | — | — | — | — | — | — | — |
| Chemical component total | | | mol/kg | 0.337 | 0.224 | 0.354 | 0.134 | 0.274 | 0.387 | 0.437 |
| Component (A)/Component (C) (mol ratio) | | | | 2.94 | 1.47 | 1.47 | 2.94 | 2.94 | 5.88 | 1.49 |
| pH | | | | 2.4 | 2.4 | 2.4 | 2.4 | 2.4 | 2.4 | 2.4 |
| KOH titer of composition without component (G) | | | mol/kg | 0.07 | 0.07 | 0.07 | 0.14 | 0.14 | 0.14 | 0.14 |
| Polishing speed | | | Å/min | 18000 | 18000 | 24000 | 3900 | 25000 | 23000 | 25000 |
| Surface roughness | | | nm | 1.1 | 1.0 | 0.7 | 0.8 | 1.1 | 1.5 | 0.9 |

The following conclusions may be drawn from the results in Tables 2 and 3. Specifically, the polishing agents of Experimental Examples 2-1 to 2-4 exhibited satisfactory polishing speed. The surface roughnesses were also satisfactory.

Polishing agent X2-1 of Experimental Example 2-5, which had lower values for the contents of the component (A), component (B) and component (C) than the values of the invention, exhibited a lower polishing speed than polishing agent 2-1 of Experimental Example 2-1.

Polishing agent X2-2 of Experimental Example 2-6, which was the same as Experimental Example 2-5 except for having only the same content of the component (A) as Experimental Example 2-1, and polishing agent X2-3 of Experimental Example 2-7, which had a higher content of the component (A) than Experimental Example 2-6, both exhibited slight increase in polishing speed but had lower polishing speeds than Experimental Example 2-1. That is, the effect of increased polishing speed is not significant if only the content of the component (A) is increased.

Polishing agent X2-4 of Experimental Example 2-8, which was the same as Experimental Example 2-5 except for having only the same content of the amino acid glycine as Experimental Example 2-1, and polishing agent X2-5 of Experimental Example 2-9, which was the same as Experimental Example 2-5 except for having only the same content of the protective film-forming agent benzotriazole as Experimental Example 2-1, both exhibited lower polishing speed compared to Experimental Example 2-5 and lower polishing speed even compared to Experimental Example 2-1.

The polishing speed was reduced with polishing agent X2-6 of Experimental Example 2-10, which had the same contents of the component (B) and component (C) as polishing agent 2-1 of Experimental Example 2-1 but had a lower content of the component (A) than the value of the invention.

The polishing speed was reduced with polishing agent X2-7 of Experimental Example 2-11 and polishing agent X2-8 of Experimental Example 2-12, which had the same contents of the component (A) and component (C) as polishing agent 2-1 of Experimental Example 2-1 but had lower content of the component (B) than the value of the invention.

The polishing speed was also reduced with polishing agent X2-9 of Experimental Example 2-13, which had the same contents of the component (A) and component (B) as polishing agent 2-1 of Experimental Example 2-1 but had a lower content of the component (C) than the value of the invention.

The polishing speed was lower than Experimental Example 2-1 when using polishing agent X2-10 of Experimental Example 2-14, which had higher contents of the component (A), component (B) and component (C) than Experimental Example 2-5 but had a ratio of 1.49 for the component (A) content (mol/kg)/component (C) content (mol/kg) ratio, which was lower than 2.00.

The relationship between Experimental Example 2-1 and Experimental Example 2-5 indicates that the polishing speed is inadequate when the contents of component (A), component (B) and component (C) are not at certain levels.

Also, the relationship between Experimental Example 2-1 and Experimental Examples 2-6, 2-8 and 2-9 indicates that the polishing speed is inadequate when the content of only one component from among component (A), component (B) and component (C) is at the same level while the other component contents are lower than the values of the invention.

Furthermore, the relationship between Experimental Example 2-1 and Experimental Examples 2-10 to 2-14 indicates that the polishing speed is inadequate when the contents of two components from among component (A), component (B) and component (C) are at the same level while the content of the other component is lower than the value of the invention.

The results also indicate that the polishing speed can be efficiently increased if the 3 components, component (A), component (B) and component (C), are at least at certain contents.

Also, the polishing speeds in Experimental Examples 2-6, 2-8 and 2-9 varied in the following manner, based on the polishing speed of Experimental Example 2-5. The polishing speed increased by 3000 Å/min when only the content of the component (A) was equivalent to Experimental Example 2-1 (Experimental Example 2-6). The polishing speed decreased by 3000 Å/min when only the content of the component (B) was equivalent to Experimental Example 2-1 (Experimental Example 2-8), and it decreased by 3000 Å/min when only the content of the component (C) was equivalent to Experimental Example 2-1 (Experimental Example 2-9). Based on the changes in polishing speed in Experimental Examples 2-6, 2-8 and 2-9, it can also be predicted that if the contents of all 3 of the components are the same as Experimental Example 2-1, the polishing speed will decrease by 3000 Å/min obtained by summing the variation in polishing speed of Experimental Examples 2-6, 2-8 and 2-9 with respect to Experimental Example 2-5. In actuality, however, the increase was 11000 Å/min as shown by the results of Experimental Example 2-1, and thus it was confirmed that a higher effect of increased polishing speed is obtained by simultaneously increasing the contents of the 3 components.

This indicates that optimizing the contents of the component (A), component (B) and component (C) can yield a polishing agent that exhibits a markedly higher polishing speed for copper than common polishing agents. In particular, a polishing agent with a polishing speed exceeding 30000 Å/min for copper is optimal for rapid polishing of large amounts of copper, for formation of TSV, for example.

Experimental Examples 3-1 to 3-15

Preparation of Polishing Agents

Polishing agents of Experimental Examples 3-1 to 3-15 will now be described. Experimental Example 3-8 corresponds to the first embodiment of the invention, Experimental Example 3-7 corresponds to the second embodiment of the invention, and Experimental Examples 3-1 to 3-6, 3-9 and 3-10 correspond to the third embodiment of the invention.

Experimental Example 3-1

To 600 g of purified water there were added 5.1 g of sulfuric acid at a concentration 96%, 5.8 g of phosphoric acid at a concentration 85%, 20.3 g of glycine, 4.0 g of benzotriazole (BTA), 5.4 g of oxalic acid and 50 g of colloidal silica with a mean particle size of 70 nm (solid content: 20%), as an abrasive, and the components other than colloidal silica were dissolved. There was further added 25% ammonia aqueous solution to adjust the pH of the solution to 2.6, and then purified water was further added to a total amount of 700 g. To this there was added 300 g of hydrogen peroxide water (reagent grade, 30% aqueous solution) to obtain polishing agent 3-1 with a total amount of 1000 g.

Experimental Example 3-2

Polishing agent 3-2 was prepared in the same manner as Experimental Example 3-1, except that the oxalic acid content was 14.0 g and the additive amount of purified water was adjusted for a total amount of 1000 g.

Experimental Example 3-3

Polishing agent 3-3 was prepared in the same manner as Experimental Example 3-1, except that 7.0 g of maleic acid was added instead of 5.4 g of oxalic acid, and the additive amount of purified water was adjusted for a total amount of 1000 g.

Experimental Example 3-4

Polishing agent 3-4 was prepared in the same manner as Experimental Example 3-1, except that 5.9 g of maleic anhydride was added instead of 5.4 g of oxalic acid, and the additive amount of purified water was adjusted for a total amount of 1000 g.

Experimental Example 3-5

Polishing agent 3-5 was prepared in the same manner as Experimental Example 3-1, except that 6.2 g of malonic acid was added instead of 5.4 g of oxalic acid, and the additive amount of purified water was adjusted for a total amount of 1000 g.

Experimental Example 3-6

Polishing agent 3-6 was prepared in the same manner as Experimental Example 3-1, except that 11.5 g of citric acid was added instead of 5.4 g of oxalic acid, and the additive amount of purified water was adjusted for a total amount of 1000 g.

Experimental Example 3-7

Polishing agent 3-7 was prepared in the same manner as Experimental Example 3-1, except that the benzotriazole content was 7.9 g, and the additive amount of purified water was adjusted for a total amount of 1000 g.

Experimental Example 3-8

Polishing agent 3-8 was prepared in the same manner as Experimental Example 3-1, except that no oxalic acid was added, and the additive amount of purified water was adjusted for a total amount of 1000 g.

Experimental Example 3-9

Polishing agent 3-9 was prepared in the same manner as Experimental Example 3-1, except that 9.0 g of tartaric acid was added instead of 5.4 g of oxalic acid, and the additive amount of purified water was adjusted for a total amount of 1000 g.

Experimental Example 3-10

Polishing agent 3-10 was prepared in the same manner as Experimental Example 3-1, except that 8.0 g of malic acid was added instead of 5.4 g of oxalic acid, and the additive amount of purified water was adjusted for a total amount of 1000 g.

Experimental Example 3-11

To 600 g of water there were added 2.6 g of sulfuric acid at a concentration 96%, 2.9 g of phosphoric acid at a concentration 85%, 10.2 g of glycine, 2.0 g of benzotriazole and 50 g of colloidal silica with a mean particle size of 70 nm (solid content: 20%), as an abrasive, and the components other than colloidal silica were dissolved. There was further added 25% ammonia aqueous solution to adjust the pH of the solution to 2.6, and then purified water was further added for a total amount of 700 g. To this there was added 300 g of hydrogen peroxide water (reagent grade, 30% aqueous solution) to obtain polishing agent X3-1 with a total amount of 1000 g.

Experimental Example 3-12

Polishing agent X3-2 was prepared in the same manner as Experimental Example 3-11, except that the sulfuric acid content was 5.1 g, the phosphoric acid content was 5.8 g, and the additive amount of purified water was adjusted for a total amount of 1000 g.

Experimental Example 3-13

Polishing agent X3-3 was prepared in the same manner as Experimental Example 3-11, except that the glycine content was 20.3 g, 36% hydrochloric acid was used instead of ammonia aqueous solution for pH adjustment, and the additive amount of purified water was adjusted for a total amount of 1000 g.

Experimental Example 3-14

Polishing agent X3-4 was prepared in the same manner as Experimental Example 3-11, except that the benzotriazole content was 4.0 g, and the additive amount of purified water was adjusted for a total amount of 1000 g.

Experimental Example 3-15

Polishing agent X3-5 was prepared in the same manner as Experimental Example 3-11, except that an additional 5.4 g of oxalic acid was added as an organic acid, and the additive amount of purified water was adjusted for a total amount of 1000 g.

(Measurement of Polishing Agent pH)

The pH values of polishing agents 3-1 to 3-10 and X3-1 to X3-5 were measured using a Model PH81 by Yokogawa Electric Corp. The measured values for the pH are listed in Tables 4 and 5.

(Measurement of Neutralizing Titer)

Test solutions for measurement of neutralizing titer (test solutions 3-1 to 3-10 and test solutions X3-1 and X3-5) were prepared in the same manner as Experimental Examples 3-1 to 3-15, except that no organic acid and 25% ammonia aqueous solution was added. The neutralization titration equivalent for each test solution was measured with potassium hydroxide using a pH meter (Model PH81 by Yokogawa Electric Corp.), in a thermobath at 25° C.

The neutralization titration equivalent was determined in the following manner. Specifically, 50 milliliters of the test solution was placed in a 100 milliliter-volume beaker, aqueous potassium hydroxide at 20% concentration was added dropwise while stirring at 80 rpm with a stirrer, and the neutralization titration equivalent was calculated from the additive amount of aqueous potassium hydroxide when the pH value reached 4.0.

(Measurement of Polishing Speed)

A substrate (by Global Net Corp.) comprising a 20 μm-thick copper film formed on a silicon substrate with a 12-inch diameter (30.5 cm)(φ) was prepared. The substrate was used for CMP polishing while adding one of the polishing agents 3-1 to 3-10 and polishing agents X3-1 to X3-5 dropwise to a polishing cloth attached to the platen of the polishing apparatus.

The polishing conditions were as follows.

Polishing apparatus: CMP polishing machine (trade name: Reflexion by Applied Materials, Inc.)

Polishing cloth: Foamed polyurethane resin with closed cells (trade name: IC-1010, by Rohm & Haas).

Polishing pressure: 32 kPa

Platen/head rotational speed: 60/55 rpm

Polishing agent flow rate: 300 ml/min

The polishing speed was calculated in the following manner. First, a VR-120 (trade name) metal film thickness meter by Hitachi Kokusai Engineering Co., Ltd. was used for measurement of the sheet resistance at 81 locations on the copper film surface in the diameter direction of the substrate, and the average values were calculated before and after CMP polishing. Also, the difference in film thickness of the copper film before and after CMP polishing was determined by calculation from the difference in the average value before and after polishing, and then the polishing speed was calculated.

Tables 4 and 5 show the constituent components of polishing agents 3-1 to 3-10 and polishing agents X3-1 to X3-5, and the pH value, the neutralization titration equivalent of potassium hydroxide and the polishing speed evaluation results, for each polishing agent.

TABLE 4

| Component name | Substance name | Concentration | Formula weight | | 3-1 | 3-2 | 3-3 | 3-4 | 3-5 | 3-6 | 3-7 |
|---|---|---|---|---|---|---|---|---|---|---|---|
| (D) Abrasive | Colloidal silica | — | | g/kg | 10 | 10 | 10 | 10 | 10 | 10 | 10 |
| | | — | | mass % | 1 | 1 | 1 | 1 | 1 | 1 | 1 |
| (A) Inorganic acids | Sulfuric acid | 96% | | g/kg | 5.1 | 5.1 | 5.1 | 5.1 | 5.1 | 5.1 | 5.1 |
| | | | 98.08 | mol/kg | 0.050 | 0.050 | 0.050 | 0.050 | 0.050 | 0.050 | 0.050 |
| | Phosphoric acid | 85% | | g/kg | 5.8 | 5.8 | 5.8 | 5.8 | 5.8 | 5.8 | 5.8 |
| | | | 98.00 | mol/kg | 0.050 | 0.050 | 0.050 | 0.050 | 0.050 | 0.050 | 0.050 |
| (B) Amino acid | Glycine | 100% | | g/kg | 20.3 | 20.3 | 20.3 | 20.3 | 20.3 | 20.3 | 20.3 |
| | | | 75.07 | mol/kg | 0.270 | 0.270 | 0.270 | 0.270 | 0.270 | 0.270 | 0.270 |
| (C) Protective film-forming agent | BTA | 100% | | g/kg | 4.0 | 4.0 | 4.0 | 4.0 | 4.0 | 4.0 | 7.9 |
| | | | 119.13 | mol/kg | 0.034 | 0.034 | 0.034 | 0.034 | 0.034 | 0.034 | 0.067 |
| (G) Organic acids | Oxalic acid | 100% | | g/kg | 5.4 | 14.0 | — | — | — | — | 5.4 |
| | | | 90.03 | mol/kg | 0.060 | 0.156 | — | — | — | — | 0.060 |
| | Malonic acid | 100% | | g/kg | — | — | — | — | 6.2 | — | — |
| | | | 104.06 | mol/kg | — | — | — | — | 0.060 | — | — |
| | Maleic acid | 100% | | g/kg | — | — | 7.0 | — | — | — | — |
| | | | 116.07 | mol/kg | — | — | 0.060 | — | — | — | — |
| | Maleic anhydride | 100% | | g/kg | — | — | — | 5.9 | — | — | — |
| | | | 98.06 | mol/kg | — | — | — | 0.060 | — | — | — |
| | Citric acid | 100% | | g/kg | — | — | — | — | — | 11.5 | — |
| | | | 192.12 | mol/kg | — | — | — | — | — | 0.060 | — |
| | Tartaric acid | 100% | | g/kg | — | — | — | — | — | — | — |
| | | | 150.09 | mol/kg | — | — | — | — | — | — | — |
| | Malic acid | 100% | | g/kg | — | — | — | — | — | — | — |
| | | | 134.09 | mol/kg | — | — | — | — | — | — | — |
| (E) Oxidizing agent | Hydrogen peroxide | — | | mass % | 9.00 | 9.00 | 9.00 | 9.00 | 9.00 | 9.00 | 9.00 |
| pH regulators | Ammonia water | — | | — | q.s. | q.s. | q.s. | q.s. | q.s. | q.s. | q.s. |
| | Hydrochloric acid | — | | — | — | — | — | — | — | — | — |
| | Component (A) total | | | mol/kg | 0.100 | 0.100 | 0.100 | 0.100 | 0.100 | 0.100 | 0.100 |
| | Component (B) total | | | mol/kg | 0.270 | 0.270 | 0.270 | 0.270 | 0.270 | 0.270 | 0.270 |

TABLE 4-continued

| Component name | Substance name | Concentration Formula weight | | 3-1 | 3-2 | Experimental Example 3-3 | 3-4 | 3-5 | 3-6 | 3-7 |
|---|---|---|---|---|---|---|---|---|---|---|
| Component (C) total | | | mol/kg | 0.034 | 0.034 | 0.034 | 0.034 | 0.034 | 0.034 | 0.067 |
| Component (G) total | | | mol/kg | 0.060 | 0.156 | 0.060 | 0.060 | 0.060 | 0.060 | 0.060 |
| Chemical component total | | | mol/kg | 0.464 | 0.560 | 0.464 | 0.464 | 0.464 | 0.464 | 0.497 |
| Component (A)/Component (C) (mol ratio) | | | | 2.94 | 2.94 | 2.94 | 2.94 | 2.94 | 2.94 | 1.49 |
| pH | | | | 2.4 | 2.4 | 2.4 | 2.4 | 2.4 | 2.4 | 2.4 |
| KOH titer of composition without component (G) | | | mol/kg | 0.14 | 0.14 | 0.14 | 0.14 | 0.14 | 0.14 | 0.14 |
| Polishing speed | | | Å/min | 44000 | 53000 | 46000 | 48000 | 43000 | 48000 | 34000 |

TABLE 5

| Component name | Substance name | Concentration Formula weight | | 3-8 | 3-9 | 3-10 | Experimental Example 3-11 | 3-12 | 3-13 | 3-14 | 3-15 |
|---|---|---|---|---|---|---|---|---|---|---|---|
| (D) Abrasive | Colloidal silica | — | g/kg | 10 | 10 | 10 | 10 | 10 | 10 | 10 | 10 |
| | | — | mass % | 1 | 1 | 1 | 1 | 1 | 1 | 1 | 1 |
| (A) Inorganic acids | Sulfuric acid | 96% 98.08 | g/kg mol/kg | 5.1 0.050 | 5.1 0.050 | 5.1 0.050 | 2.6 0.025 | 5.1 0.050 | 2.6 0.025 | 2.6 0.025 | 2.6 0.025 |
| | Phosphoric acid | 85% 98.00 | g/kg mol/kg | 5.8 0.050 | 5.8 0.050 | 5.8 0.050 | 2.9 0.025 | 5.8 0.050 | 2.9 0.025 | 2.9 0.025 | 2.9 0.025 |
| (B) Amino acid | Glycine | 100% 75.07 | g/kg mol/kg | 20.3 0.270 | 20.3 0.270 | 20.3 0.270 | 10.2 0.136 | 10.2 0.136 | 20.3 0.270 | 10.2 0.136 | 10.2 0.136 |
| (C) Protective film-forming agent | BTA | 100% 119.13 | g/kg mol/kg | 4.0 0.034 | 4.0 0.034 | 4.0 0.034 | 2.0 0.017 | 2.0 0.017 | 2.0 0.017 | 4.0 0.034 | 2.0 0.017 |
| (G) Organic acids and acid anhydrides | Oxalic acid | 100% 90.03 | g/kg mol/kg | — — | — — | — — | — — | — — | — — | — — | 5.4 0.060 |
| | Malonic acid | 100% 104.06 | g/kg mol/kg | — — | — — | — — | — — | — — | — — | — — | — — |
| | Maleic acid | 100% 116.07 | g/kg mol/kg | — — | — — | — — | — — | — — | — — | — — | — — |
| | Maleic anhydride | 100% 98.06 | g/kg mol/kg | — — | — — | — — | — — | — — | — — | — — | — — |
| | Citric acid | 100% 192.12 | g/kg mol/kg | — — | — — | — — | — — | — — | — — | — — | — — |
| | Tartaric acid | 100% 150.09 | g/kg mol/kg | — — | 9.0 0.060 | — — | — — | — — | — — | — — | — — |
| | Malic acid | 100% 134.09 | g/kg mol/kg | — — | — — | 8.0 0.060 | — — | — — | — — | — — | — — |
| (E) Oxidizing agent | Hydrogen peroxide | — | mass % | 9.00 | 9.00 | 9.00 | 9.00 | 9.00 | 9.00 | 9.00 | 9.00 |
| pH regulators | Ammonia water | — | — | q.s. | q.s. | q.s. | q.s. | q.s. | — | q.s. | q.s. |
| | Hydrochloric acid | — | — | — | — | — | — | — | q.s. | — | — |
| Component (A) total | | | mol/kg | 0.100 | 0.100 | 0.100 | 0.050 | 0.100 | 0.050 | 0.050 | 0.050 |
| Component (B) total | | | mol/kg | 0.270 | 0.270 | 0.270 | 0.136 | 0.136 | 0.270 | 0.136 | 0.136 |
| Component (C) total | | | mol/kg | 0.034 | 0.034 | 0.034 | 0.017 | 0.017 | 0.017 | 0.034 | 0.017 |
| Component (G) total | | | mol/kg | — | 0.060 | 0.060 | — | — | — | — | 0.060 |
| Chemical component total | | | mol/kg | 0.404 | 0.464 | 0.464 | 0.203 | 0.253 | 0.337 | 0.220 | 0.263 |
| Component (A)/Component (C) (mol ratio) | | | | 2.94 | 2.94 | 2.94 | 2.94 | 5.88 | 2.94 | 1.47 | 2.94 |
| pH | | | | 2.4 | 2.4 | 2.4 | 2.4 | 2.4 | 2.4 | 2.4 | 2.4 |
| KOH titer of composition without component (G) | | | mol/kg | 0.14 | 0.14 | 0.14 | 0.07 | 0.14 | 0.07 | 0.07 | 0.07 |
| Polishing speed | | | Å/min | 32000 | 31000 | 30000 | 21000 | 24000 | 18000 | 24000 | 28000 |

The following conclusions were drawn from the results shown in Table 4 and Table 5. Specifically, polishing agents 3-1 to 3-10 of Experimental Examples 3-1 to 3-10 exhibited satisfactory polishing speed. Also, observation of the polished silicon substrate surfaces confirmed that they had been smoothly polished.

On the other hand, polishing agent X3-1 had contents of the component (A), component (B) and component (C) outside of the prescribed ranges of the invention, and therefore exhibited low polishing speed. Polishing agent X3-2 was the same as polishing agent X3-1 except for having the same content of the component (A) as polishing agent 3-1, and although slight increase in polishing speed was seen compared to polishing agent X3-1, the polishing speed was reduced compared to polishing agent 3-1. Polishing agent X3-3 was the same as polishing agent X3-1, except for having the same content of the component (B) as polishing agent 3-1 and using different substances for pH adjustment, and it had lower polishing speed compared to polishing agent 3-1 and polishing agent X3-1. Polishing agent X3-4 was the same as polishing agent X3-1, except for having the same content of the component (C) as polishing agent 3-1, and it had lower polishing speed compared to polishing agent 3-1 and polishing agent X3-1.

Polishing agent X3-5 was the same as polishing agent X3-1, except for having the same content of the component (G) as polishing agent 3-1, but it had lower polishing speed compared to polishing agent 3-1.

Polishing agent X3-2, which was the same as polishing agent X3-1 except for having a content of the component (A) equivalent to polishing agent 3-1, had a polishing speed that was increased by 3000 Å/min compared to polishing agent X3-1. Polishing agent X3-3, which was the same as polishing agent X3-1 except for having a content of the component (B) equivalent to polishing agent 3-1, had a polishing speed that was reduced by 3000 Å/min compared to polishing agent X3-1. Polishing agent X3-4, which was the same as polishing agent X3-1 except for having a content of the component (C) equivalent to polishing agent 3-1, had a polishing speed that was reduced by 3000 Å/min compared to polishing agent X3-1. Polishing agent X3-5, which was the same as polishing agent X3-1 except for having a content of the component (D) equivalent to polishing agent 3-1, had a polishing speed that was increased by 7000 Å/min compared to polishing agent X3-1.

Based on these results, when the contents of the component (A), component (B), component (C) and component (G) are all equivalent to polishing agent 3-1, the increase in polishing speed with respect to polishing agent X3-1 would normally be expected to be about 4000 Å/min obtained by summing the variation in polishing speed of polishing agents X3-2 to X3-5 with respect to polishing agent X3-1. However, it was confirmed that the polishing speed with polishing agent 3-1 increased by 23000 Å/min with respect to polishing agent X3-1, and that the improving effect on polishing speed is increased when the contents of the component (A), component (B), component (C) and component (D) are simultaneously within the prescribed ranges of the invention while the component (A) content (mol/kg)/component (C) content (mol/kg) ratio is 2.00 or greater.

The polishing speed was increased in polishing agent 3-1 with respect to polishing agent 3-7, wherein the component (A) content (mol/kg)/component (C) content (mol/kg) ratio was less than 2.00 even though the contents of the component (A), component (B) and component (C) were in the prescribed ranges of the invention.

Polishing agent 3-1 also had an increased polishing speed with respect to polishing agent 3-8 which had approximately twice the contents of the component (A), component (B) and component (C) of polishing agent X3-1 but contained no component (G).

Regarding organic acids with 2 carboxyl groups, polishing agent 3-1 exhibited increased polishing speed compared to polishing agent 3-9 which contained tartaric acid having a pKa of 2.82, and polishing agent 3-10 which contained malic acid having a pKa of 3.46.

This confirmed that when the contents of the component (A), component (B) and component (C) are within the prescribed ranges of the invention while the relationship between the contents of the component (A) and component (C) is specified, a polishing agent is obtained which exhibits highly superior polishing speed compared to conventional polishing agents for CMP polishing of copper. Thus, a polishing agent with a polishing speed exceeding 30000 Å/min for copper is especially optimal for rapid polishing of large amounts of copper, for formation of TSVs, for example.

EXPLANATION OF SYMBOLS

1: Silicon substrate, 2: element, 4: copper layer, 5, 6: bumps, 100, 200, 300: substrates.

The invention claimed is:

1. A polishing agent for copper polishing, comprising
(A) 0.08-1.0 mol/kg of a multivalent inorganic acid,
(B) 0.20-2.0 mol/kg of an amino acid,
(C) 0.03-0.3 mol/kg of a protective film forming agent,
(D) an abrasive,
(E) an oxidizing agent, and
(F) water,
wherein a proportion of a content of the component (A) with respect to a content of the component (C) is 2.00-12, and
the inorganic acid (A) is one or more selected from sulfuric acid, chromic acid, carbonic acid, hydrogen sulfide, sulfurous acid, thiosulfuric acid, selenic acid, telluric acid, tellurous acid, tungstic acid, phosphonic acid, phosphoric acid, phosphotungstic acid, vanadic acid, silicotungstic acid, pyrophosphoric acid and tripolyphosphoric acid,
wherein the inorganic acid (A) comprises an acid with pKa value of not greater than 0 and an acid with pKa value of greater than 0, and
wherein an amount of potassium hydroxide required to increase pH to 4 is at least 0.10 mol per 1 kg of the polishing agent for copper polishing.

2. The polishing agent for copper polishing according to claim 1, wherein pH is 1.5-4.0.

3. The polishing agent for copper polishing according to claim 1, wherein, the component (A) is at least one kind selected from among sulfuric acid and phosphoric acid.

4. The polishing agent for copper polishing according to claim 1, comprising an amino acid with a pKa value of 2-3 as the component (B).

5. The polishing agent for copper polishing according to claim 1, wherein the component (C) is a triazole compound.

6. The polishing agent for copper polishing according to claim 5, wherein the triazole compound is at least one kind selected from among benzotriazole and its derivatives.

7. The polishing agent for copper polishing according to claim 1, wherein the component (D) is at least one kind selected from among colloidal silica and colloidal alumina, and a mean particle size of the component (D) is not greater than 100 nm.

8. The polishing agent for copper polishing according to claim 1, wherein the component (E) is at least one kind selected from among hydrogen peroxide, persulfuric acid and persulfuric acid salts.

9. A polishing method, comprising polishing a copper-containing metal film using the polishing agent for copper polishing according to claim 1, to remove at least a portion of the metal film.

10. The polishing method according to claim 9, wherein a maximum thickness of the metal film is 5 μm or greater.

11. The polishing method according to claim 9, wherein a maximum thickness of the metal film is 10 μm or greater.

12. The polishing method according to claim 9, wherein a polishing speed for the metal film is at least 30000 Å/min.

13. A polishing agent for copper polishing, comprising
(A) 0.08-1.0 mol/kg of a multivalent inorganic acid,
(B) 0.20-2.0 mol/kg of an amino acid,
(C) 0.03-0.3 mol/kg of a protective film-forming agent,
(D) an abrasive,
(E) an oxidizing agent,
(F) water, and (G) at least one kind selected from among organic acids and their acid anhydrides, wherein the inorganic acid (A) is one or more selected from sulfuric acid, chromic acid, carbonic acid, hydrogen sulfide, sulfurous acid, thiosulfuric acid, selenic acid, telluric acid, tellurous acid, tungstic acid, phosphonic acid, phosphoric acid, phosphotungstic acid, vanadic acid, silicotungstic acid, pyrophosphoric acid and tripolyphosphoric acid, wherein the inorganic acid (A) comprises an acid with pKa value of not greater than 0 and an acid with pKa value of greater than 0, and wherein an amount of potassium hydroxide required to increase pH to 4 is at least 0.10 mol per 1 kg of the composition, the pH being of a composition obtained by removing component (G) from the polishing agent for copper polishing.

14. The polishing agent for copper polishing according to claim 13, wherein the component (G) is at least one kind selected from among organic acids with two carboxyl groups and pKa values of not greater than 2.7, their acid anhydrides, and organic acids with 3 or more carboxyl groups.

15. The polishing agent for copper polishing according to claim 13, wherein the component (G) is at least one kind selected from among oxalic acid, maleic acid, maleic anhydride, malonic acid and citric acid.

16. The polishing agent for copper polishing according to claim 13, wherein pH is 1.5-4.0.

17. The polishing agent for copper polishing according to claim 13 wherein the component (A) is at least one kind selected from among sulfuric acid and phosphoric acid.

18. The polishing agent for copper polishing according to claim 13, comprising an amino acid with a pKa value of 2-3 as the component (B).

19. The polishing agent for copper polishing according to claim 13, wherein the component (C) is a triazole compound.

20. The polishing agent for copper polishing according to claim 19, wherein the triazole compound is at least one kind selected from among benzotriazole and its derivatives.

21. The polishing agent for copper polishing according to claim 13, wherein the component (D) is at least one kind selected from among colloidal silica and colloidal alumina, and a mean particle size of the component (D) is not greater than 100 nm.

22. The polishing agent for copper polishing according to claim 13 wherein the component (E) is at least one kind selected from among hydrogen peroxide, persulfuric acid and persulfuric acid salts.

23. A polishing method, comprising polishing a copper-containing metal film using the polishing agent for copper polishing according to claim 13, to remove at least a portion of the metal film.

24. The polishing method according to claim 23, wherein a maximum thickness of the metal film is 5 μm or greater.

25. The polishing method according to claim 23, wherein a maximum thickness of the metal film is 10 μm or greater.

26. The polishing method according to claim 23, wherein a polishing speed for the metal film is at least 30000 Å/min.

27. A polishing agent for copper polishing, comprising
(A) 0.08-1.0 mol/kg of a multivalent inorganic acid,
(B) 0.20-2.0 mol/kg of an amino acid,
(C) 0.03-0.3 mol/kg of a protective film-forming agent,
(D) an abrasive,
(E) an oxidizing agent,
(F) water, and
(G) at least one kind selected from among organic acids and their acid anhydrides, wherein a proportion of a content of the component (A) with respect to a content of the component (C) is 2.00-12, and the inorganic acid (A) is one or more selected from sulfuric acid, chromic acid, carbonic acid, hydrogen sulfide, sulfurous acid, thiosulfuric acid, selenic acid, telluric acid, tellurous acid, tungstic acid, phosphonic acid, phosphoric acid, phosphotungstic acid, vanadic acid, silicotungstic acid, pyrophosphoric acid and tripolyphosphoric acid, wherein the inorganic acid (A) comprises an acid with pKa value of not greater than 0 and an acid with pKa value of greater than 0, wherein an amount of potassium hydroxide required to increase pH to 4 is at least 0.10 mol per 1 kg of the composition, the pH being of the composition obtained by removing component (G) from the polishing agent for copper polishing.

28. The polishing agent for copper polishing according to claim 27, wherein the component (G) is at least one kind selected from among organic acids with two carboxyl groups and pKa values of not greater than 2.7, their acid anhydrides, and organic acids with 3 or more carboxyl groups.

29. The polishing agent for copper polishing according to claim 27, wherein the component (G) is at least one kind selected from among oxalic acid, maleic acid maleic anhydride, malonic acid and citric acid.

30. The polishing agent for copper polishing according to claim 27, wherein pH is 1.5-4.0.

31. The polishing agent for copper polishing according to claim 27, wherein the component (A) is at least one kind selected from among sulfuric acid and phosphoric acid.

32. The polishing agent for copper polishing according to claim 27, comprising an amino acid with a pKa value of 2-3 as the component (B).

33. The polishing agent for copper polishing according to claim 27, wherein the component (C) is a triazole compound.

34. The polishing agent for copper polishing according to claim 27, wherein the triazole compound is at least one kind selected from among benzotriazole and its derivatives.

35. The polishing agent for copper polishing according to claim 27, wherein the component (D) is at least one kind selected from among colloidal silica and colloidal alumina, and a mean particle size of the component (D) is not greater than 100 nm.

36. The polishing agent for copper polishing according to claim 27, wherein the component (B) is at least one kind selected from among hydrogen peroxide, persulfuric acid and persulfuric acid salts.

37. A polishing method, comprising polishing a copper-containing metal film using the polishing agent for copper polishing according to claim 27, to remove at least a portion of the metal film.

38. The polishing method according to claim 37, wherein a maximum thickness of the metal film is 5 μm or greater.

39. The polishing method according to claim 37, wherein a maximum thickness of the metal film is 10 μm or greater.

40. The polishing method according to claim 37, wherein a polishing speed for the metal film is at least 30000 Å/min.

41. The polishing agent for copper polishing according to claim 1, the inorganic acid (A) is one or more selected from sulfuric acid, chromic acid, carbonic acid, hydrogen sulfide, sulfurous acid, thiosulfuric acid, selenic acid, telluric acid, tellurous acid, tungstic acid, phosphonic acid, phosphoric acid, vanadic acid, pyrophosphoric acid and tripolyphosphoric acid.

42. The polishing agent for copper polishing according to claim 13, the inorganic acid (A) is one or more selected from sulfuric acid, chromic acid, carbonic acid, hydrogen sulfide, sulfurous acid, thiosulfuric acid, selenic acid, telluric acid, tellurous acid, tungstic acid, phosphonic acid, phosphoric acid, vanadic acid, pyrophosphoric acid and tripolyphosphoric acid.

43. The polishing agent for copper polishing according to claim 27, the inorganic acid (A) is one or more selected from sulfuric acid, chromic acid, carbonic acid, hydrogen sulfide, sulfurous acid, thiosulfuric acid, selenic acid, telluric acid, tellurous acid, tungstic acid, phosphonic acid, phosphoric acid, vanadic acid, pyrophosphoric acid and tripolyphosphoric acid.

\* \* \* \* \*